United States Patent
Yeung et al.

(10) Patent No.: US 8,421,514 B1
(45) Date of Patent: Apr. 16, 2013

(54) HAZARD-FREE MINIMAL-LATENCY FLIP-FLOP (HFML-FF)

(75) Inventors: Alfred Yeung, Fremont, CA (US);
Hamid Partovi, Los Altos, CA (US);
Luca Ravezzi, San Francisco, CA (US);
John Ngai, Boxborough, MA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 104 days.

(21) Appl. No.: 13/225,044

(22) Filed: Sep. 2, 2011

Related U.S. Application Data

(63) Continuation-in-part of application No. 13/077,949, filed on Mar. 31, 2011, and a continuation-in-part of application No. 13/160,569, filed on Jun. 15, 2011.

(51) Int. Cl.
*H03K 3/289* (2006.01)

(52) U.S. Cl.
USPC ........... 327/202; 327/201; 327/211; 327/212; 327/218

(58) Field of Classification Search .................. 327/201, 327/202, 211, 212, 218
See application file for complete search history.

(56) References Cited

U.S. PATENT DOCUMENTS

| | | | |
|---|---|---|---|
| 5,592,114 A | 1/1997 | Wu et al. | |
| 6,028,453 A | 2/2000 | Kong | |
| 6,043,696 A | 3/2000 | Klass et al. | |
| 6,069,495 A | 5/2000 | Ciccone et al. | |
| 6,121,807 A | 9/2000 | Klass et al. | |
| 6,448,831 B1 | 9/2002 | Hunt, Jr. et al. | |
| 7,259,605 B2 | 8/2007 | Chatterjee et al. | |
| 7,278,074 B2 * | 10/2007 | Mitra et al. | 714/724 |
| 7,583,123 B2 | 9/2009 | Kanda et al. | |
| 7,714,628 B2 | 5/2010 | Sachdev et al. | |
| 2003/0210085 A1 | 11/2003 | Larsson et al. | |
| 2005/0242861 A1 | 11/2005 | Kanda et al. | |
| 2007/0146034 A1 | 6/2007 | Acharya | |

* cited by examiner

*Primary Examiner* — John Poos

(57) ABSTRACT

A hazard-free minimal-latency flip-flop (HFML-FF) is provided. A master latch includes an input to accept a D1 signal, an input to accept a clock signal, an input to accept an inverted shadow-D2 signal, and an output to supply a D2 signal. The master latch has an input to accept a shadow-D1 signal, an input to accept the clock signal, and an output to supply a shadow-D2 signal and the inverted shadow-D2 signal. The slave latch has an input to accept the D2 signal, an input to accept the clock signal, an input to accept an inverted shadow-Q signal, and an output to supply a Q signal. The slave latch has an input to accept either the D2 signal or the shadow-D2 signal, an input to accept the clock signal, and an output to supply a shadow-Q signal and the inverted shadow-Q signal. The design may use clocked inverters or pass gates.

19 Claims, 28 Drawing Sheets

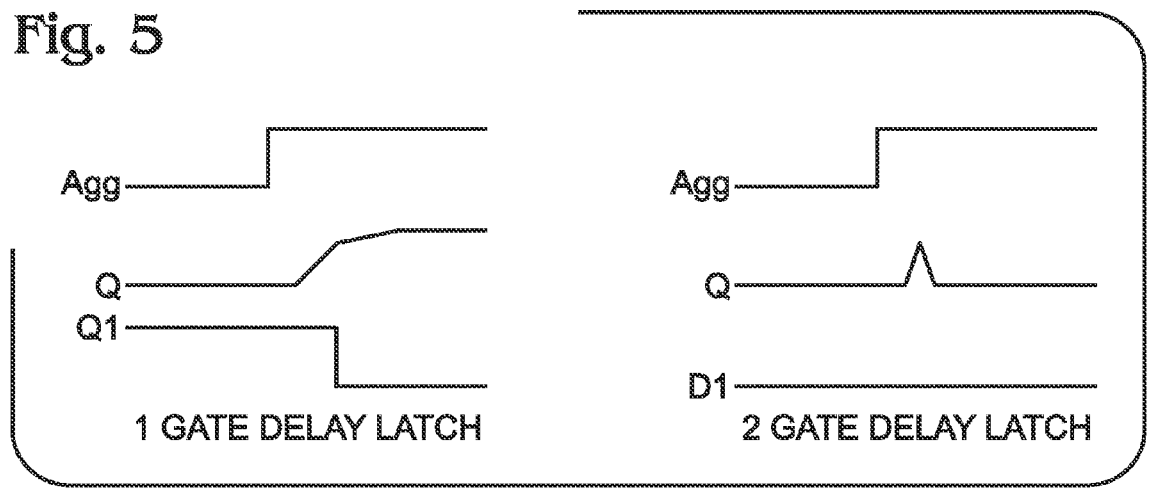
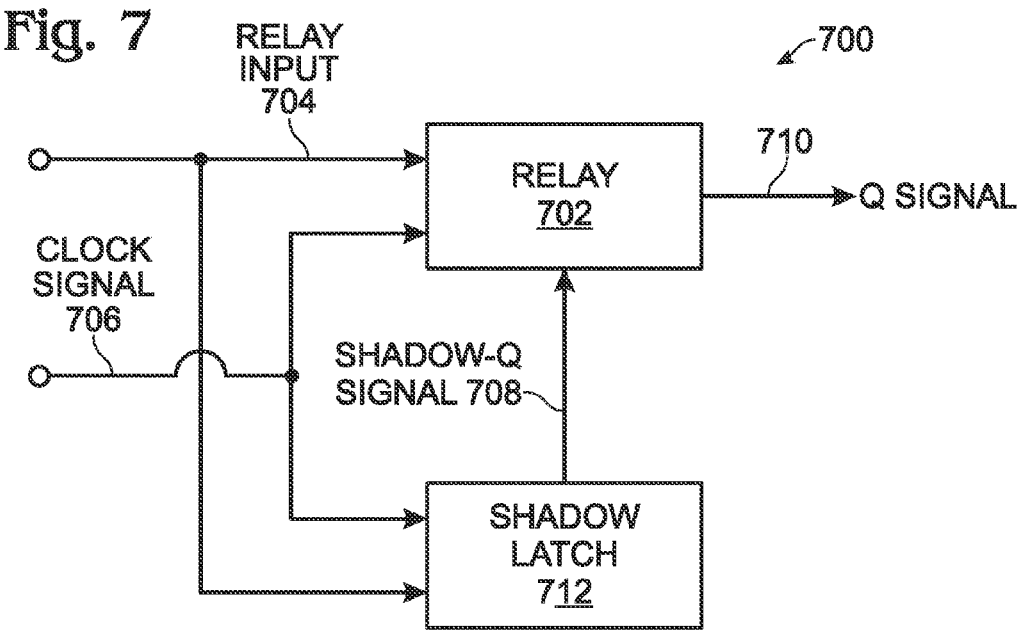

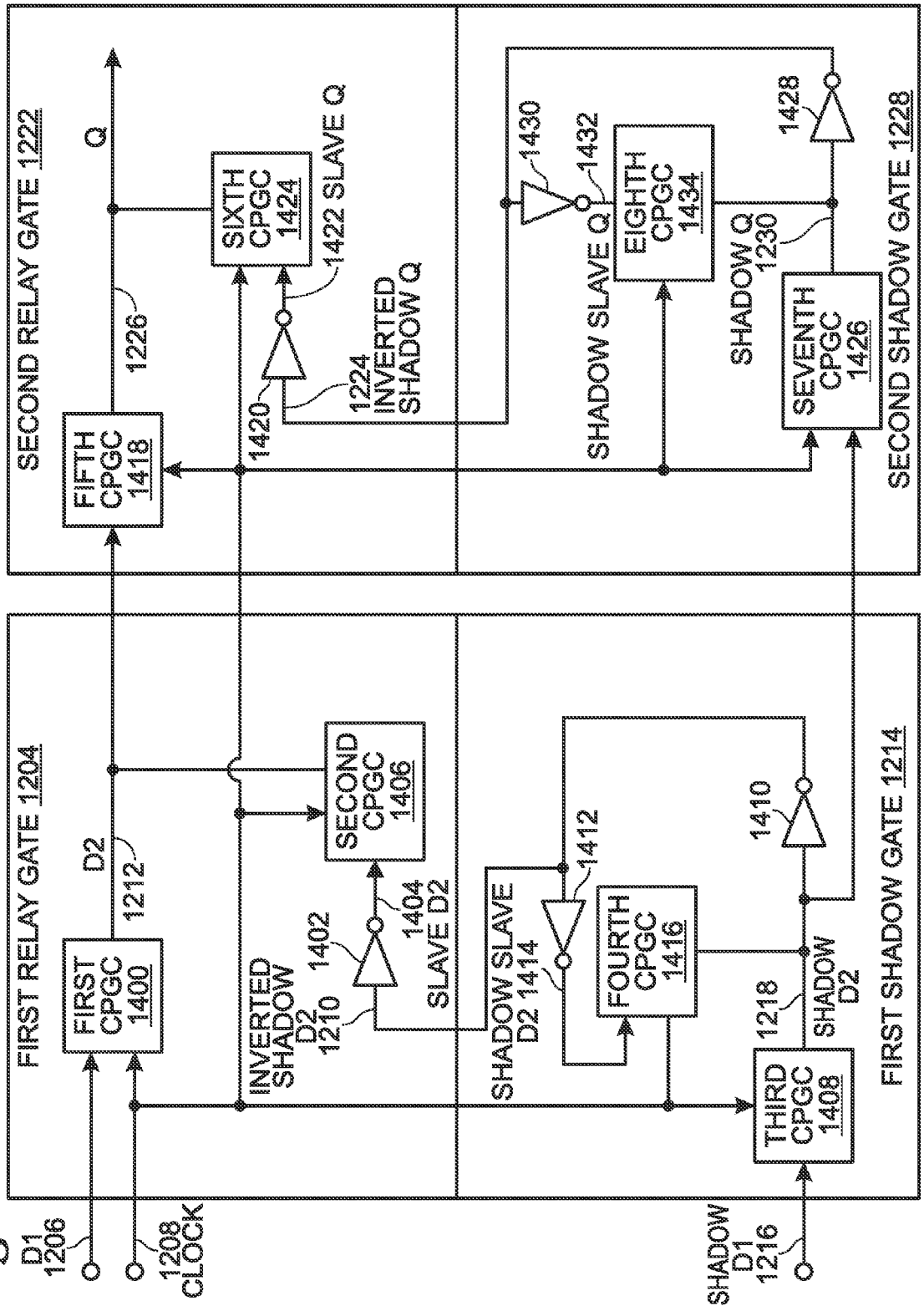

HAZARD-FREE MINIMAL-LATENCY FLIP-FLOP (HFML-FF)

RELATED APPLICATIONS

This application is a Continuation-in-Part (CIP) of a patent application entitled, SHADOW LATCH, invented by Alfred Yeung et al., Ser. No. 13/077,949, filed Mar. 31, 2011, which is incorporated herein by reference.

This application is a CIP of a patent application entitled, PASS GATE SHADOW LATCH, invented by Hamid Partovi et al., Ser. No. 13/160,569, filed Jun. 15, 2011, which is incorporated herein by reference.

BACKGROUND OF THE INVENTION

1. Field of the Invention

This invention generally relates to electronic circuitry and, more particularly, to a two-gate delay flip-flop with a shadow stage, which is immune from corruption, to support the latch in its opaque (hold) phase.

2. Description of the Related Art

Whether it is a phase-based design implemented with latches as a fundamental memory element, or edge-based design implemented with back-to-back latches (flip-flops) as the fundamental memory element, latches are an essential building block in modern very large scale integration (VLSI) designs. With conflicting properties of delay, area, power, and robustness, it is difficult to design latches that satisfy all design requirements.

Latches are commonly used in VLSI designs either by themselves or as part of an edge-triggered Flip-Flop (FF) due to their memory holding function. A latch has two phases of operation: in the transparent phase, data flows freely from D to Q, and the amount of time for this to occur is its native delay (Tdq). In the opaque phase, data may toggle on the input D, but Q holds its previous value. Which phase the latch operates in is determined by the phase of the clock input. In the context of being a FF building block, there are setup time (Tsu) and clock delay (Tcq) characteristics of the FF. However, those two parameters together form the Tdq native delay, and it is useful to discuss this value as the metric for performance.

FIGS. 1A and 1B are schematic diagrams of a pass gate (prior art). As configured, when the clock signal (CLK) is low, the device is in a tri-state mode, meaning the output impedance is high. When CLK is high, the input signal (D) is passed to the output. Alternatively, the CLK signal can be connected to the gate of the PMOS transistor and the inverted CLK signal (CK1) connected to the gate of the NMOS transistor, in which case the input is passed when. CLK is low. The device of FIG. 1A may also be depicted as shown in FIG. 1B.

FIG. 2 is a schematic diagram of a conventional latch design using pass gates (prior art). The latch is a clocked state element (from D to D1), which is protected from the output by an inverter (from D1 to Q). This design has the benefit of being simple to understand and extremely robust. However, it has two gate-delay elements, which limits its performance. Note: CLK and CK1 are opposite phases of a binary clock signal.

FIG. 3 is a schematic diagram of a conventional latch design with improved gate delay (prior art). As an alternative to the design of FIG. 2, the output inverter is removed to provide a faster Tdq. However, this design has a major flaw in that the memory state element is exposed to the output. The memory state is the output value maintained by pass gate 302, when pass gate 300 is in its opaque phase. When the memory state is protected by the inverter, as in FIG. 2, the effects of any external coupling effects are minimized. When the memory state is exposed, as in FIG. 3, uncontrolled external routes and coupling events can directly affect the feedback loop's ability to maintain the state. If this happens, the memory state becomes corrupted and irrecoverable.

FIG. 4 is a timing diagram contrasting the differences in delay between the circuits of FIG. 2 and FIG. 3. In terms of gate delay, the right-most figure, associated with the latch of FIG. 3, is one gate faster than the left-most figure, which is associated with the latch of FIG. 2.

FIG. 5 is a timing diagram depicting the differences in memory state corruption between the circuits of FIG. 2 and FIG. 3. The diagram illustrates a glitch event from external routing upon the output pin Q. If the state-node is exposed as in FIG. 3, an external aggressor net "Agg" can potentially flip the state of the latch (left-most figure). In the design of FIG. 2, a noise event can only produce a glitch on Q instead of flipping the state of the latch (right-most figure).

FIG. 6 is a schematic drawing of a conventional edge-triggered flip-flop using pass gates (prior art). Edge-triggered flip-flops are commonly used in high-performance synchronous designs due to their robustness and ease of use. A FF is made up of two latches, conventionally described as master and slave latches. As shown, each latch is based upon the design depicted in FIG. 2. Each of these latches is transparent in alternating clock phases, and this creates the functionality of a FF. The delay characteristics of a FF are described by its delay through the master latch (Tsu), the delay through the slave latch (Tcq) and hold time (Thd). Of the three characteristics, Tsu and Tcq are sometimes combined as the total FF delay (Tdq) to describe the overall delay characteristic of the FF.

The key elements of the flip-flop are its master latch state nodes (MS) and its slave latch state nodes (SS). The state nodes of latches are made up of clocked cross-coupled pass gates to provide a feedback loop. This feedback loop maintains the state of this memory element when the latch is opaque. Therefore, these state nodes must be carefully designed to prevent any noise related glitch event from corrupting the state of the latch.

FIG. 19 is a schematic drawing of a positive edge-triggered true single-phase clocking (TSPC) flip-flop (prior art). The TSPC flip-flop (TSPC-FF) has one of the lower latencies ($t_{DQ}=t_{SU}+t_{CQ}$), and more, it can incorporate complex logic, but suffers from a number of well-known structural problems which render it unsafe for large-scale use in commercial integrated circuits.

During the low phase of the clock, the flip-flop master is transparent, that is, changes at input D appear inverted on node mDb. But since MN2, gated by the clock, is off, the transfer of mDb to the slave is blocked; DbMF is in pre-charge, and held at Vdd by MP2. Since DbMF is high, MP3, as well as the clock-gated MN3, is off; QB is in high impedance (floating) and holds state dynamically by the charge stored on its endemic capacitance and external load.

CLK→Vdd

On the rising edge of the clock, the master becomes opaque and enters "high-impedance"; MP1 turns off, cutting off "mDb" from Vdd. However, as the pull down of the master is not clocked, mDb is allowed to transition low. It should however hold beyond the clock rising edge for a period of time ($t_{H, D=0}$) sufficient for DbMF to fall.

As the master enters "high-impedance", the slave becomes transparent; pre-charger MP2 turns off, MN2 and MN3 turn on. Thus:

If mDb is low, DbMF remains at Vdd but floats;

If mDb is high, DbMF monotonically falls but can float low if
D→1 after $t_{H, D=0}$ is satisfied.

In either case, the state of DbMF is inverted and transferred to the output QB.

After a short time beyond the clock edge—characterized by $t_{H, D=0}$—subsequent changes at D do not change the flip-flop state (mDb is cut off from Vdd).

During the high phase of the clock, QB is driven, but mDb and DbMF are in high impedance and hold their levels dynamically, thus, to ensure a robust operation, keepers must be placed on mDb and DbMF nodes.

CLK→0

Once the clock falls, DbMF is driven to Vdd and the clock-gated MN3 is turned off, placing QB in high impedance; its state dynamically held by the stored charge on endemic capacitance and output load. Coupling to, and leakage at this node can disturb its state. As opposed to internal nodes of mDb and DbMF, a regenerative keeper placed at QB does not ensure robust operation as the state node of the slave (QB) remains exposed to external noise. The aforementioned operational characteristics of the circuit prove it to be a positive edge-triggered flip-flop.

Thus far, the absence of keepers on mDb, DbMF, and QB nodes, as well as the exposure of the state node to output disturbance, have been pointed out as problems related to the TSPC-FF. However, there are additional structural issues, such as sensitivity to clock slope—Internal race. On the falling edge of the clock, as the flip-flop master becomes transparent, the slave is turning opaque. In the following, two race conditions relating to this transition are outlined:

Race between master and slave: if D=0 when clock falls and the clock-gated MP1 turns on, mDb will transition high, activating MN1; concurrently, MN2 is turning off. For a sufficiently low clock edge rate, both transistors in the MN1/MN2 pull-down stack will be on briefly, potentially disturbing DbMF when having a logical value of "1".

Intra-slave race: If MP2 is large, that is if DbMF precharges too quickly and activating MN4 before MN3 shuts off, a logical value of "1" at QB may be disturbed through the MN3/MN4 pull-down stack. Similarly, a sufficiently low clock slew will disturb the aforementioned level regardless of the size of MP2.

In addition, there may be $t_{CQ}$ imbalance between transitions. As DbMF is held at Vdd prior to the rising edge of the clock, there is a pronounced difference between $t_{CQ}$ 1→0 and $t_{CQ}$ 0→1 transitions: the latter must first discharge DbMF to ground. While the slower of the two transitions determines the latency of the flip-flop, the shorter $t_{CQ}$ places a more stringent limit on the minimum gate-delay budget between flip-flops so as to avoid race.

Further, there may be an output glitch when data does not transition. Assume that D=0 in two consecutive cycles. On the rising edge of the first cycle, DbMF is discharged causing QB to transition to a logical "1". When clock falls, DbMF is driven back to Vdd and QB holds state. On the rising edge of the next cycle, MN2 and MN3 come on. DbMF starts to discharge, but since MN4, gated by DbMF, is initially on, QB begins to discharge. Once DbMF is below the trip-point of the final stage, QB is returned to Vdd. Thus, the output exhibits a low-going glitch: QB 1→0→1 for D=0. Though this glitch is non-destructive, it causes additional power dissipation for downstream logic.

The TSPC-FF creates a large clock load. True to its name, true single-phase clocking is devised so that the raw clock drives all three stages of the flip-flop (MP1, MN2, MP2, MN3) thus imposing a large load on the clock.

Flip-flop latency is characterized by the data-to-Q delay which is the sum of its setup time, $t_{SU}$, to the rising clock edge and clock-to-Q delay, $t_{CQ}$, measured from the rising edge, i.e. $t_{DQ}=t_{SU}+t_{CQ}$.

In the case of TSPC-FF, the 1→0 data transition produces the larger delay for both $t_{SU}$ and $t_{CQ}$. $t_{SU}$ is determined by the delay through the MP0/MP1 stack (mDb→1) and $t_{CQ}$ comprises the discharge of DbMF through MN1/MN2 stack summed with MP3 driving the output high. Therefore it can be said that the TSPC-FF latency is about 3 gate delays.

The maximum flip-flop hold time, $t_H$, coupled with its minimum $t_{CQ}$ and clock skew, determines the minimum number of logic gates required between two flops to avoid hold time violation and race. The less positive the hold time, the easier it is for the logical effort to ensure a race-free operation. Maximum hold time for TSPC-FF is the time required for the data to remain low after the rising edge of the clock so that mDb succeeds in discharging DbMF; this amounts to slightly larger than 1 gate delay.

It would be advantageous if a latch could be designed to combine the improved gate delay of the TSPC-FF, while addressing the above-mentioned problems.

SUMMARY OF THE INVENTION

Disclosed herein is a flip-flop that improves upon a conventional latch design by reducing its delay, without exposing critical memory state nodes to noise. This improvement is achieved at a small price in area and clock loading, while maintaining the conventional logic polarity. The latch permits the fabrication of high-performance design flip-flops, where timing is a critical requirement.

Accordingly, a hazard-free minimal-latency flip-flop (HFML-FF) is provided including a master latch and a slave latch. The master latch includes a first relay gate having an input to accept a D1 signal with a binary value, an input to accept a clock signal, an input to accept an inverted shadow-D2 signal, and an output to supply a D2 signal with a binary value equal to a shadow-D2 binary value. The first relay gate output is supplied in response to the D1 signal, the inverted shadow-D2 signal, and the clock signal. A first shadow gate has an input to accept a shadow-D1 signal, an input to accept the clock signal, and an output to supply a shadow-D2 signal and the inverted shadow-D2 signal. The first shadow gate outputs are supplied in response to the shadow-D1 signal and clock signal. The slave latch includes a second relay gate having an input to accept the D2 signal, an input to accept the clock signal, an input to accept an inverted shadow-Q signal, and an output to supply a Q signal with a binary value equal to the D1 and shadow-Q signal binary values. The second relay gate output is supplied in response to the D2 signal, the inverted shadow-Q signal, and the clock signal. A second shadow gate has an input to accept either the D2 signal or the shadow-D2 signal, an input to accept the clock signal, and an output to supply a shadow-Q signal and the inverted shadow-Q signal. The second shadow gate output is supplied in response to the selected D2 signal and clock signal.

In one aspect, the first relay gate includes a first clocked pass gate circuit having an input to accept the D1 signal and an output to supply the D2 signal in a master latch pass mode. The first relay gate also includes an inverter, to accept the inverted shadow-D2 signal and supply a slave D2 signal, and a second clocked pass gate circuit having an input to accept the slave D2 signal and an output to supply the D2 signal in a master latch hold mode. The first shadow gate includes a third clocked pass gate circuit having an input to accept the shadow-D1 input signal and an output to supply the shadow- D2 signal in the master latch pass mode. An inverter has an input to accept the shadow-D2 signal and an output to supply the inverted shadow-D2 signal, and a different inverter has an input to accept the inverted shadow-D2 signal and an output to supply a shadow slave D2 signal. A fourth clocked pass gate circuit has an input to accept the shadow slave D2 signal and an output to supply the shadow D2 signal in the master latch hold mode.

In a different aspect, the first relay gate includes a first clocked inverter circuit having an input to accept the D1 signal and an output to supply the D2 signal in a master latch pass mode, and a second clocked inverter circuit having an input to accept an inverted shadow-D2 signal and an output to supply the D2 signal in a master latch hold mode. The first shadow gate includes a third clocked inverter circuit having an input to accept the shadow-D1 signal and an output to supply the shadow-D2 signal in the master latch pass mode. An inverter has an input to accept the shadow-D2 signal and an output to supply the inverted shadow-D2 signal. A fourth clocked inverter circuit has an input to accept the inverted shadow-D2 signal and an output to supply the shadow-D2 signal in the master latch hold mode.

Additional details of the above-described HFML-FF and an HFML latch are provided below.

BRIEF DESCRIPTION OF THE DRAWINGS

FIG. 5 is a timing diagram depicting the differences in memory state corruption between the circuits of FIG. 2 and FIG. 3.

FIG. 7 is a schematic block diagram of a latch device.

FIG. 14 is a schematic block diagram depicting the HFML-FF of FIG. 12 enabled using clocked pass gates.

DETAILED DESCRIPTION

FIG. 7 is a schematic block diagram of a latch device. The latch device 700 comprises a relay 702 having an input on line 704 to accept a binary relay input signal, an input on line 706 to accept a clock signal, and an input on line 708 to accept a shadow-Q signal. The relay has an output on line 710 to supply a binary Q signal equal (in polarity) to the relay input signal. The supplied Q signal is responsive to the relay input signal, the shadow-Q signal, and the clock signal. A shadow latch 712 has an input on line 704 to accept the relay input signal, an input on line 706 to accept the clock signal, and an output on line 708 to supply the shadow-Q signal. The shadow-Q signal is equal (in polarity) to an inverted Q signal, and responsive to the relay input signal and clock signal.

Figure 8:
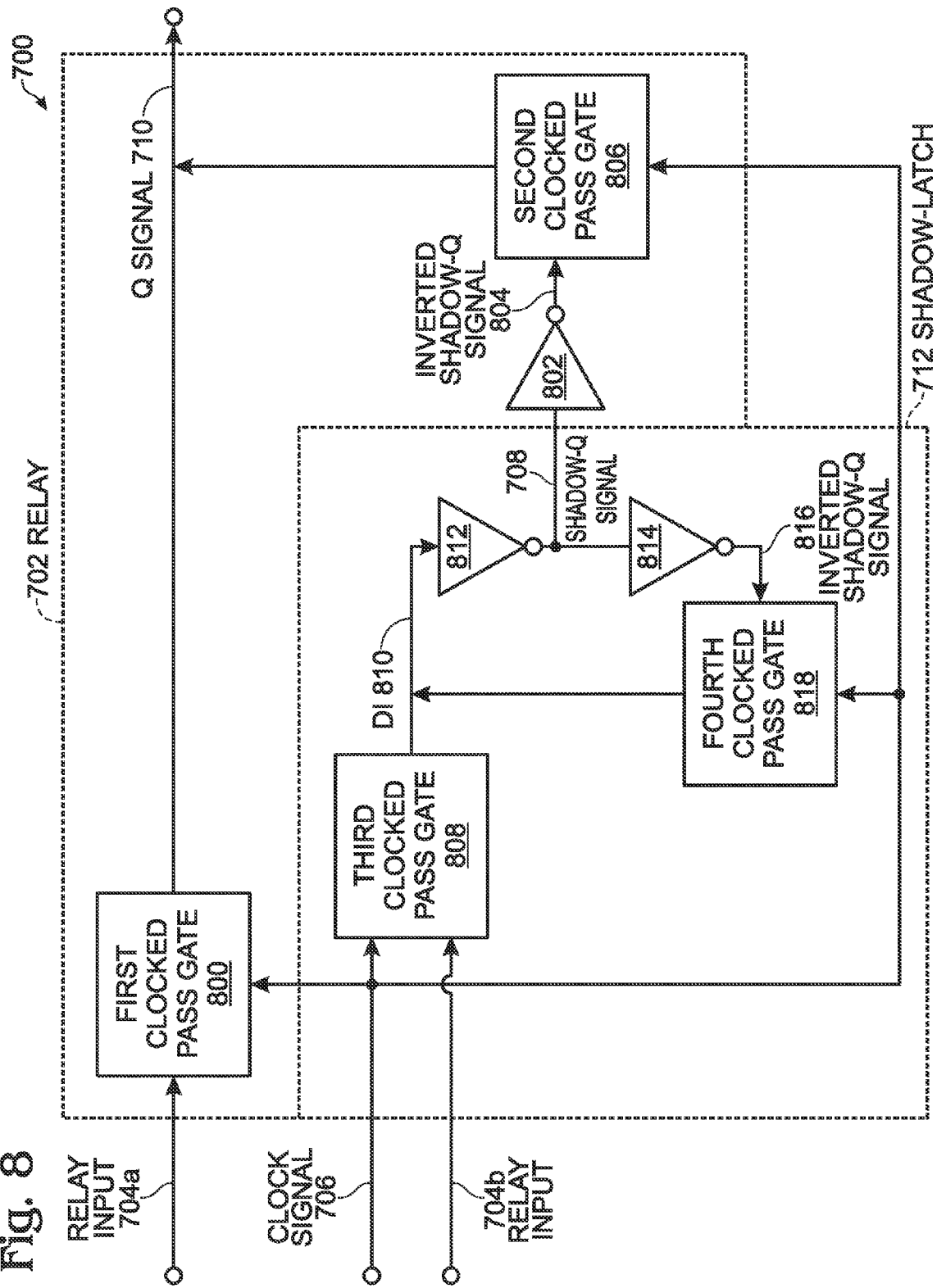
FIG. 8 is a schematic diagram depicting the latch of FIG. 7 in greater detail.

FIG. 8 is a schematic diagram depicting the latch of FIG. 7 in greater detail. The relay includes a first clocked pass gate circuit 800 having an input on line 704 to accept the relay input signal, an input on line 706 to accept the clock signal, and an output on line 710 to supply the Q signal in a pass mode. A first inverter 802 has an input on line 708 to accept the shadow-Q signal and an output on line 804 to supply an inverted shadow-Q signal. A second clocked pass gate circuit 806 has an input on line 804 to accept the inverted shadow-Q signal, an input on line 706 to accept the clock signal, and an output on line 710 to supply the Q signal in a hold mode.

The shadow latch includes a third clocked pass gate circuit 808 having an input on line 704 to accept the relay input signal, an input on line 706 to accept the clock signal, and an output on line 810 to supply a D1 signal in the pass mode. A second inverter 812 has an input on line 810 to accept the D1 signal and an output on line 708 to supply the shadow-Q signal. A third inverter 814 has an input on line 708 to accept the shadow-Q signal and an output on line 816 to supply an inverted shadow-Q signal. A fourth clocked pass gate circuit 818 has an input on line 816 to accept the inverted shadow-Q signal, an input on line 706 to accept the clock signal, and an output on line 810 to supply the D1 signal in the hold mode.

The first clocked pass gate circuit 800 supplies the Q signal in the pass mode during a first polarity of the clock signal, while the second clocked pass gate circuit 806 supplies the Q signal in the hold mode during a second polarity of the clock signal. Likewise, the third clocked pass gate circuit 808 supplies the D1 signal in the pass mode during the first polarity of the clock signal, while the fourth clocked pass gate circuit 818 supplies the D1 signal in the hold mode during the second polarity of the clock signal.

Figure 9:
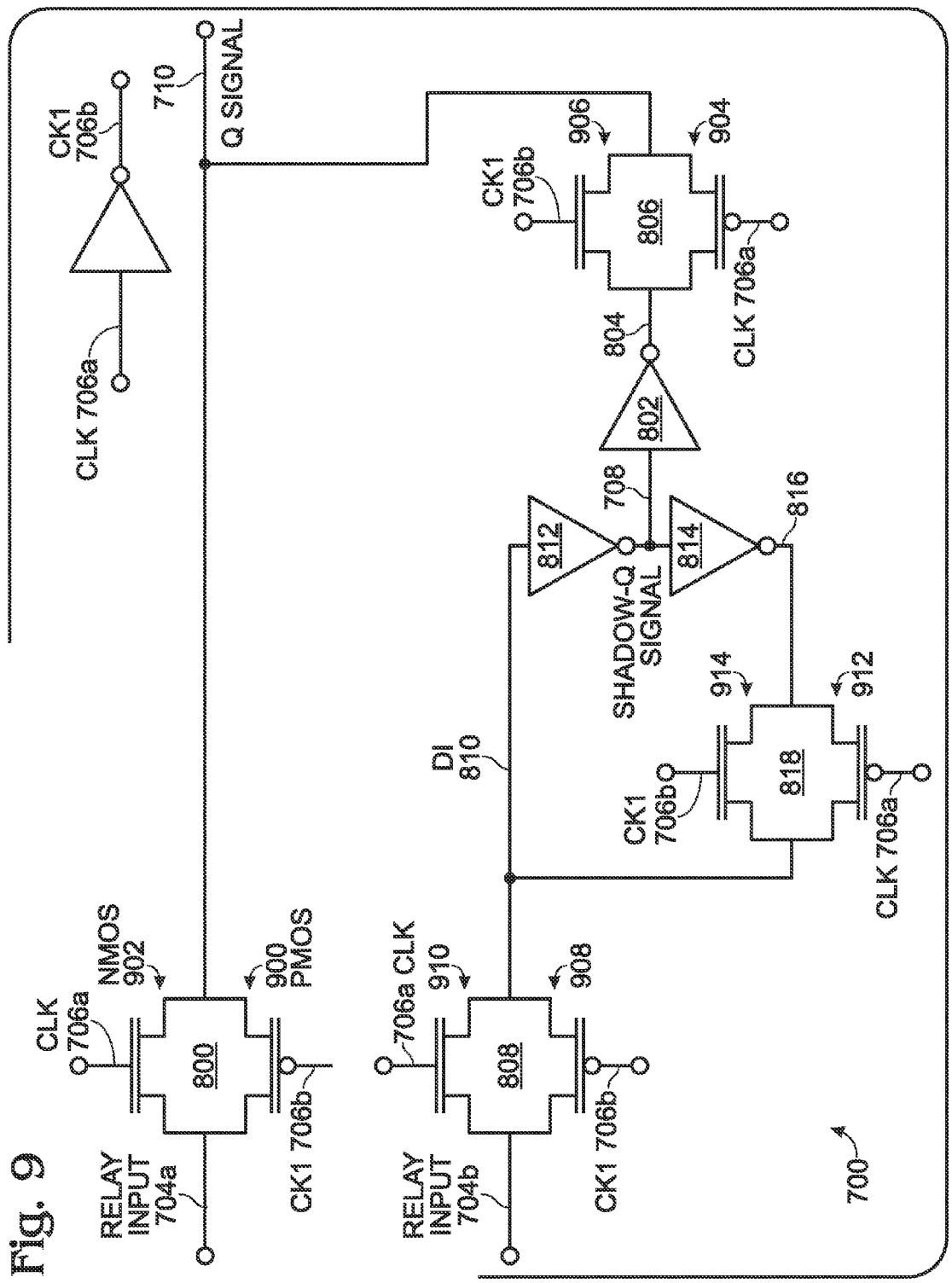
FIG. 9 is a schematic depicting the latch of FIG. 8 in greater detail.

FIG. 9 is a schematic depicting the latch of FIG. 8 in greater detail. Note: the clock signal has been further differentiated into a first phase CLK on line 706*a* and a second (opposite) phase CK1 on line 706*b*. The 180 degree clock phases may be enabled through the use of an inverter, as shown, or the two phases may be supplied by an external source. The first clocked pass gate circuit 800 includes a first PMOS field effect transistor (FET) 900 having a first source/drain (S/D) connected to the relay input signal on line 704, a second S/D connected to supply the Q signal on line 710, and a gate connected to receive an inverted clock signal (CK1) on line 706*b*. A first NMOS FET 902 has a first S/D connected to the first S/D of the first PMOS FET 900, a second S/D connected to the second S/D of the first PMOS FET, and a gate to receive the clock signal (CLK) on line 706*a*.

The second clocked pass gate circuit 806 includes a second PMOS FET 904 having a first S/D connected to receive the inverted shadow-Q signal on line 804, a second S/D to supply the Q signal, and a gate connected to receive the clock signal on line 706*a*. A second NMOS FET 906 has a first S/D connected to the first S/D of the second PMOS FET 904, a second S/D connected to the second S/D of the second PMOS FET, and a gate to receive the inverted clock signal on line 706*b*. In one aspect, the first clocked pass gate circuit 800 may be referred to as a transfer pass gate and the second clocked pass gate circuit 806 as a hold pass gate.

The third clocked pass gate circuit 808 includes a third PMOS FET 908 having a first SD connected to the relay input signal on line 704, a second S/D connected to supply the D1 signal on line 810, and a gate connected to receive an inverted clock signal on line 706*b*. A third NMOS FET 910 has a first S/D connected to the first S/D of the third PMOS FET 908, a second S/D connected to the second S/D of the third PMOS FET, and a gate to receive the clock signal on line 706*a*.

The fourth clock pass gate circuit 818 includes a fourth PMOS FET 912 having a first S/D connected to receive the inverted shadow-Q signal on line 816, a second S/D to supply the D1 signal on line 810, and a gate connected to receive the clock signal on line 706*a*. A fourth NMOS FET 914 has a first S/D connected to the first S/D of the fourth PMOS FET 912, a second S/D connected to the second S/D of the fourth PMOS FET, and a gate to receive the inverted clock signal on line 706*b*. Although not explicitly shown, the latch functions in an equivalent manner when the CLK and CK1 signals are reversed.

Although not described herein, parent application Ser. No. 13/1077,949, entitled SHADOW LATCH, discloses a single gate delay latch enabled using clocked inverter circuitry, see FIG. 8.

Figure 10:
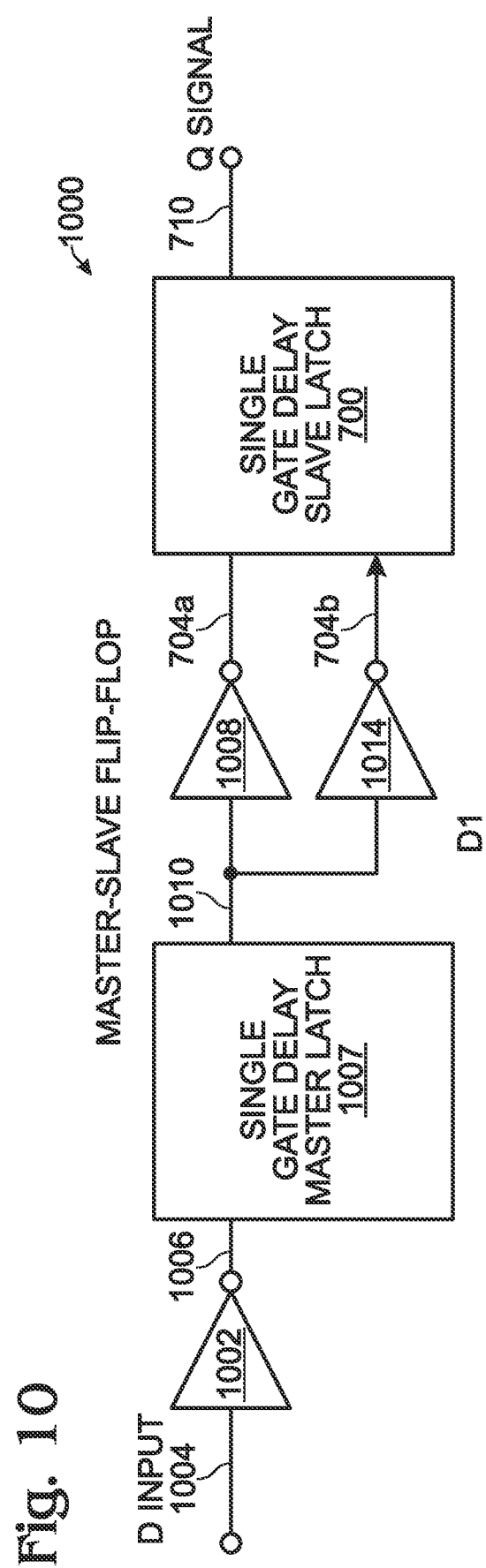
FIG. 10 is a schematic block diagram of a master-slave flip-flop.

FIG. 10 is a schematic block diagram of a master-slave flip-flop. The master-slave FF 1000 comprises a first inverter 1002 having an input on line 1004 to accept a binary first signal with a first polarity, and an output on line 1006. A single gate delay master latch 1007 has an input on line 1006 connected to the output of the first inverter 1002. In one aspect, the master latch is a clocked pass gate. A second inverter 1008 has an input on line 1010 connected to an output of the master latch 1007, and an output on line 704*a*. A third inverter 1014 has an input connected to the output of the master latch on line 1010, and an output on line 704*b*. A single gate delay slave latch 700 has inputs connected to the outputs of the second and third inverter on lines 704*a* and 704*b*, and an output on line 710 to supply a Q signal with the first polarity. Regardless of any spurious signals received at the slave latch output on line 710, a means exists for maintaining the first polarity at the slave latch output until a subsequent clock signal is received, as explained in greater detail in the explanation of FIGS. 8 and 9.

Although not described herein, parent application Ser. No. 13/077,949, entitled SHADOW LATCH, discloses a master-slave FF enabled using clocked inverter circuitry, see FIG. 12.

Figure 1A:
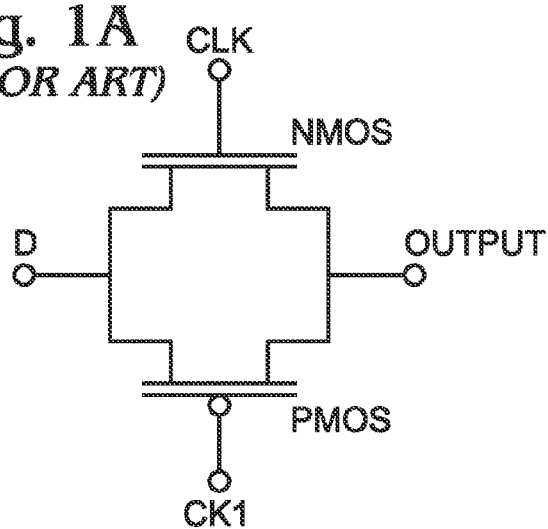
FIGS. 1A and 1B are schematic diagrams of a pass gate (prior art).
Figure 1B:
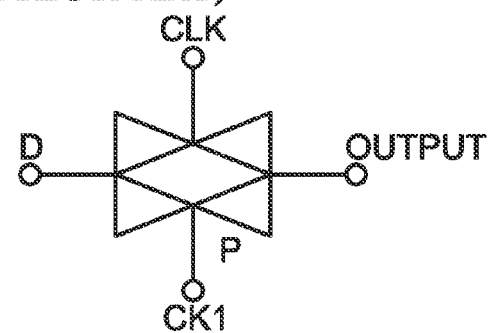
Figure 2:
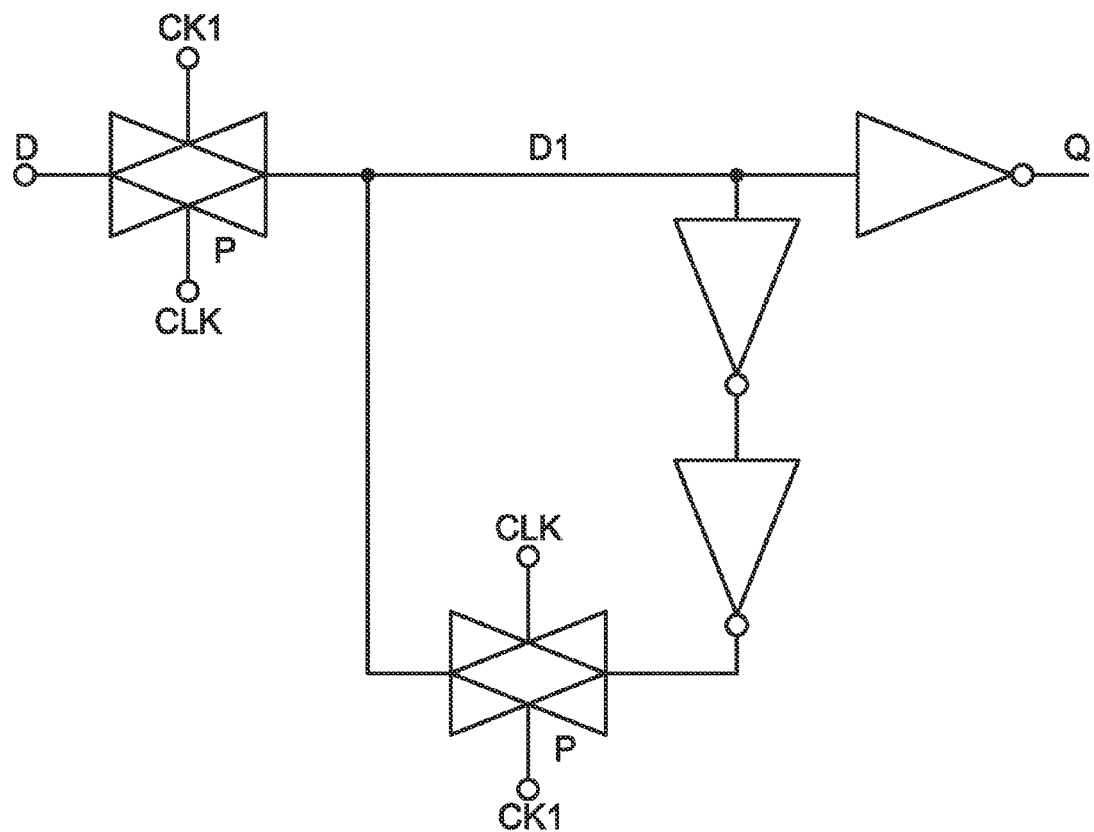
FIG. 2 is a schematic diagram of a conventional latch design using pass gates (prior art).
Figure 3:
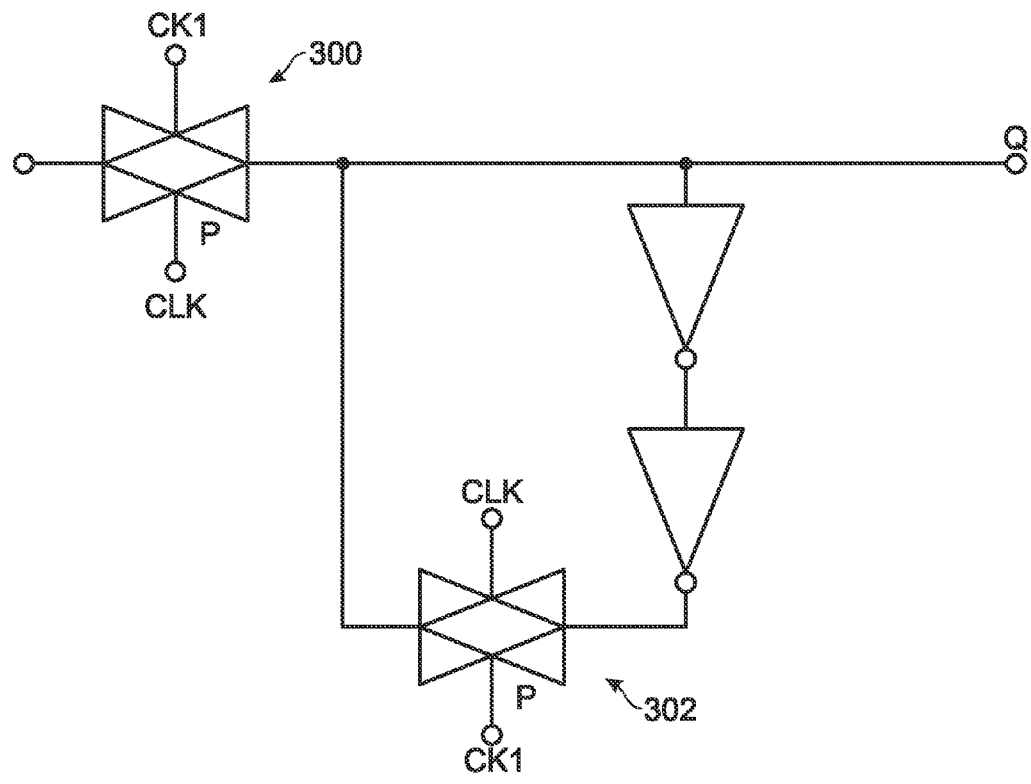
FIG. 3 is a schematic diagram of a conventional latch design with improved gate delay (prior art).
Figure 4:
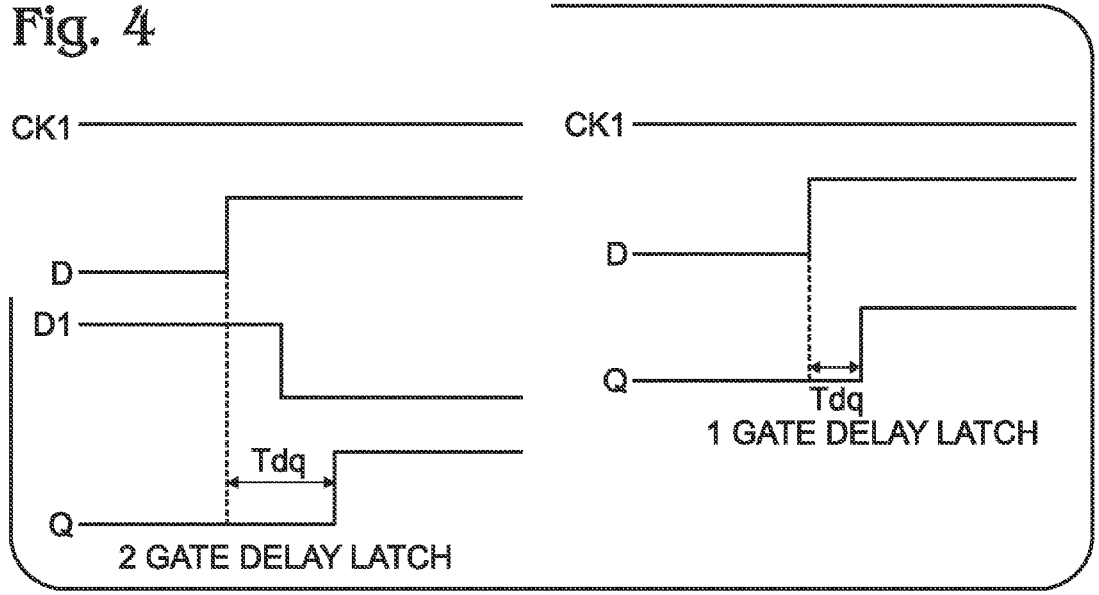
FIG. 4 is a timing diagram contrasting the differences in delay between the circuits of FIG. 2 and FIG. 3.
Figure 6:
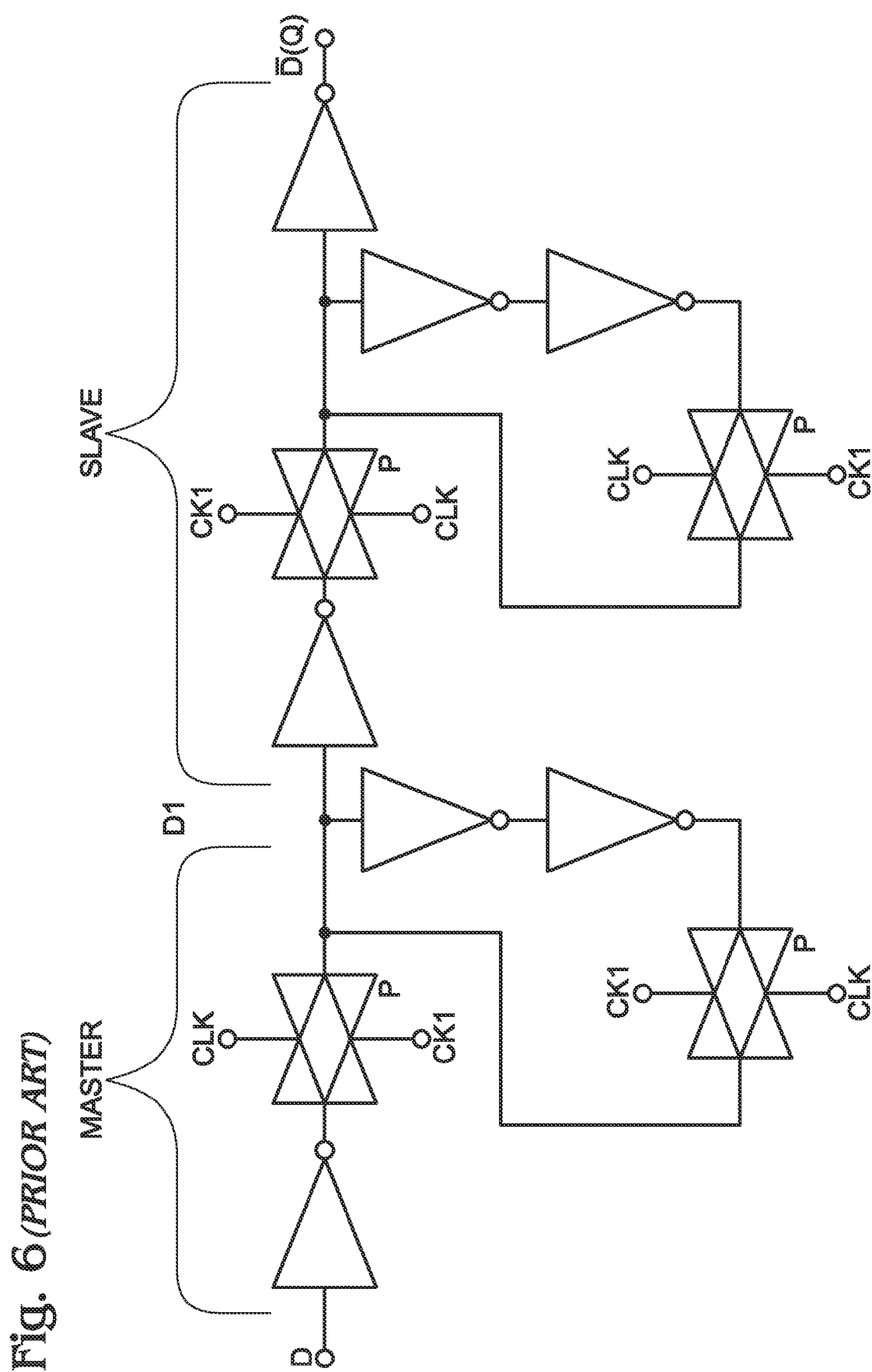
FIG. 6 is a schematic drawing of a conventional edge-triggered flip-flop using pass gates (prior art).
Figure 11:
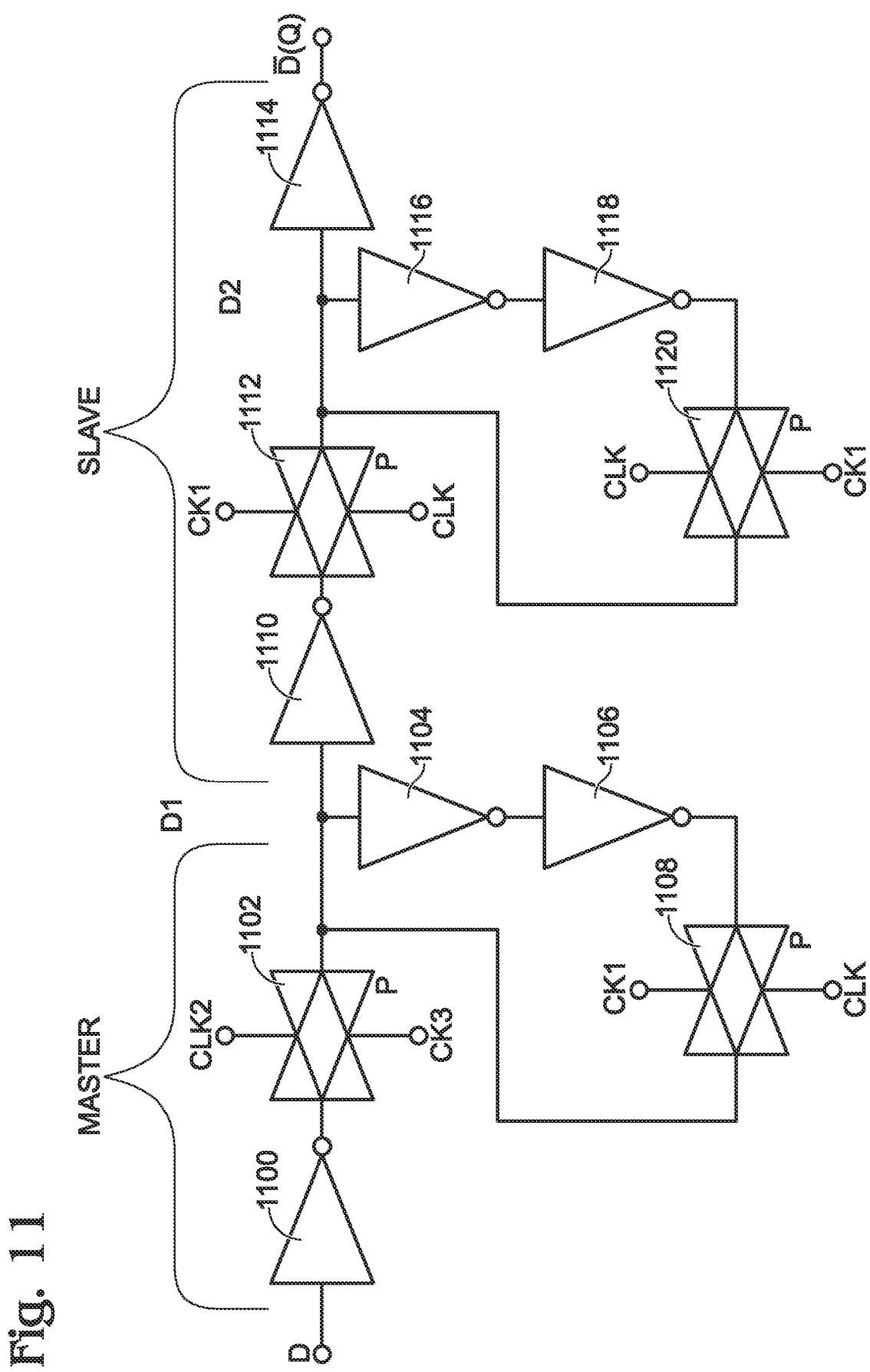
FIG. 11 is a schematic block diagram depicting the master-slave FF of FIG. 6, modified to use delayed clocks CK2 and CK3.

FIG. 11 is a schematic block diagram depicting the master-slave FF of FIG. 6, modified to use delayed clocks CK2 and CK3. An inverter 1100 accepts an input signal (D), and supplies the result to a clocked pass gate circuit 1102, which provides signal D1 in the pass mode. Two inverters in series, 1104 and 1106, accept the D1 signal, and supply the result to clocked pass gate circuit 1108, which provides the D1 signal in the hold mode. Inverter 1110 accepts the D1 signal and supplies an inverted D1 signal to pass gate circuit 1112. Inverter 1114 accepts a D2 signal from clocked pass gate circuit 1112 is the pass mode, and provides the Q signal (D inverted). Two inverters in series, 1116 and 1118, accept the D2 signal, and supply the result to clocked pass gate circuit 1128, which provides the D2 signal in the hold mode. Although not explicitly shown, an equivalent circuit could be made using clocked inverter circuits instead of clocked pass gate circuits. The Tsu of the design can be further reduced by eliminating inverter 1110. In this aspect, the Q output would be equal to the D input value.

Figure 12:
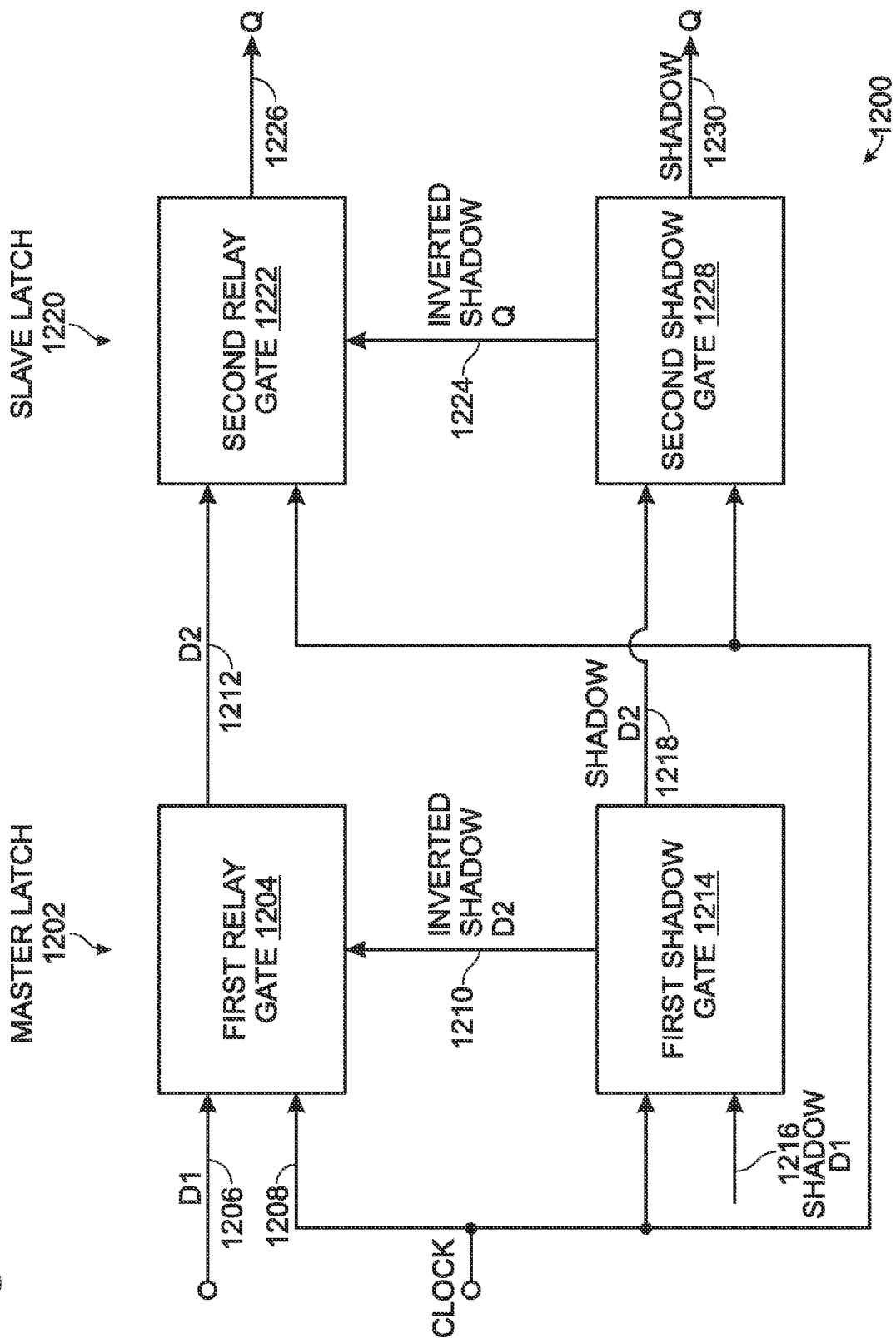
FIG. 12 is a schematic block diagram of a hazard-free minimal-latency flip-flop (HFML-FF).

FIG. 12 is a schematic block diagram of a hazard-free minimal-latency flip-flop (HFML-FF). The HFML-FF 1200 comprises a master latch 1202 including a first relay gate 1204 having an input on line 1206 to accept a D1 signal with a binary value, an input on line 1208 to accept a clock signal, an input on line 1210 to accept an inverted shadow-D2 signal, and an output on line 1212 to supply a D2 signal with a binary value equal to a shadow-D2 binary value. The first relay gate output is supplied in response to the D1 signal, the inverted shadow-D2 signal, and the clock signal. A first shadow gate 1214 has an input on line 1216 to accept a shadow-D1 signal, an input on line 1208 to accept the clock signal, and an output on line 1218 to supply a shadow-D2 signal, and an output on line 1210 to supply the inverted shadow-D2 signal. The first shadow gate outputs are supplied in response to the shadow-D1 signal and clock signal.

A slave latch 1220 includes a second relay gate 1222 having an input on line 1212 to accept the D2 signal, an input on line 1208 to accept the clock signal, an input on line 1224 to accept an inverted shadow-Q signal, and an output on line 1226 to supply a Q signal with a binary value equal to the D1 and shadow-Q signal binary values. The second relay gate 1222 output is supplied in response to the D2 signal, the inverted shadow-Q signal, and the clock signal. A second shadow gate 1228 has an input to accept either one of two signals, the D2 signal on line 1212 (not shown) or the shadow-D2 signal on line 1218 (as shown). The second shadow gate has an input on line 1208 to accept the clock signal, an output on line 1230 to supply a shadow-Q signal, and an output on line 1224 to supply the inverted shadow-Q signal. The second shadow gate output is supplied in response to the selected D2 signal (line 1212 or line 1218) and clock signal.

Figure 13A:
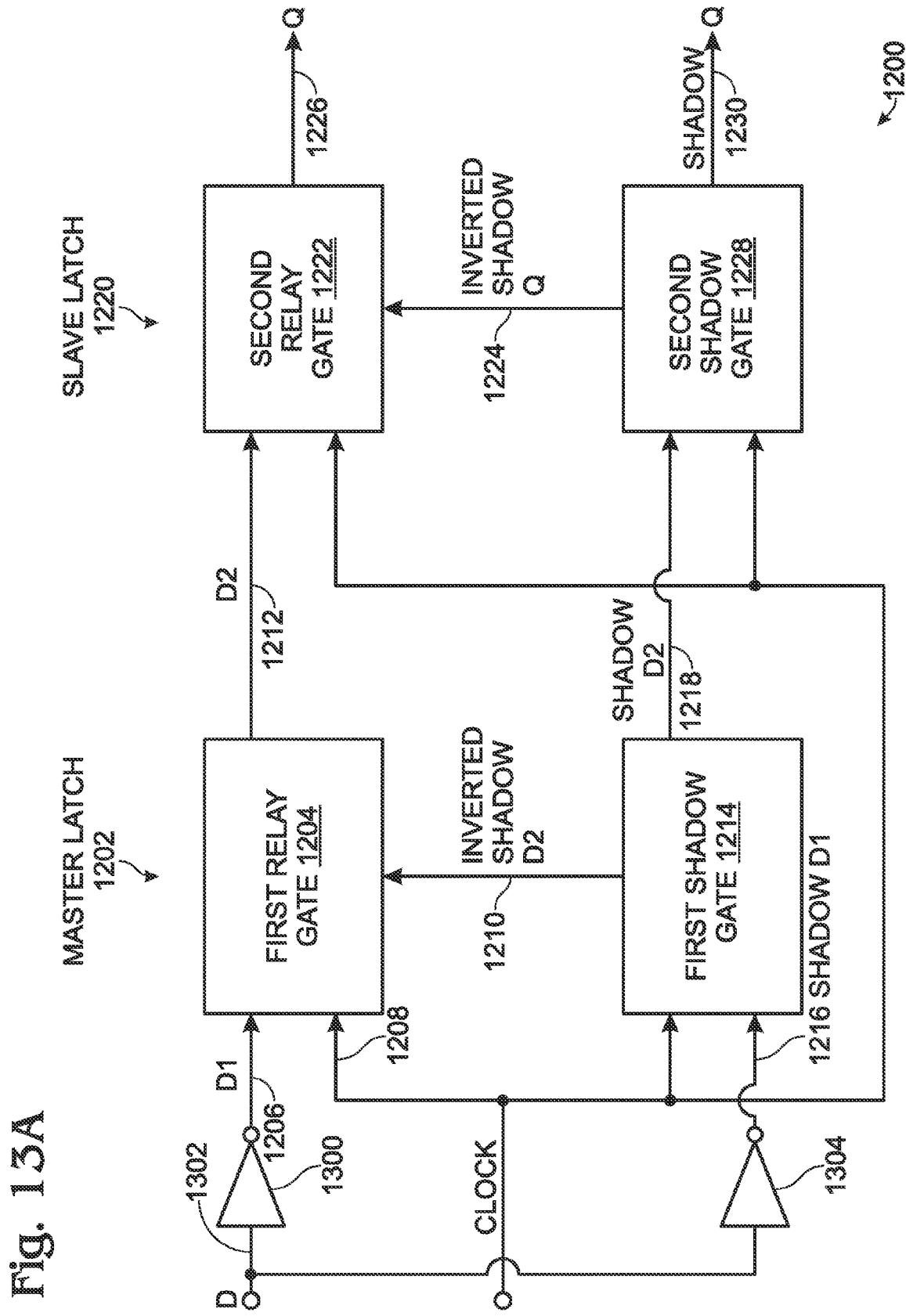
FIGS. 13A and 13B are schematic block diagrams depicting the HFML-FF of FIG. 12 with an additional signal inversion.
Figure 13B:
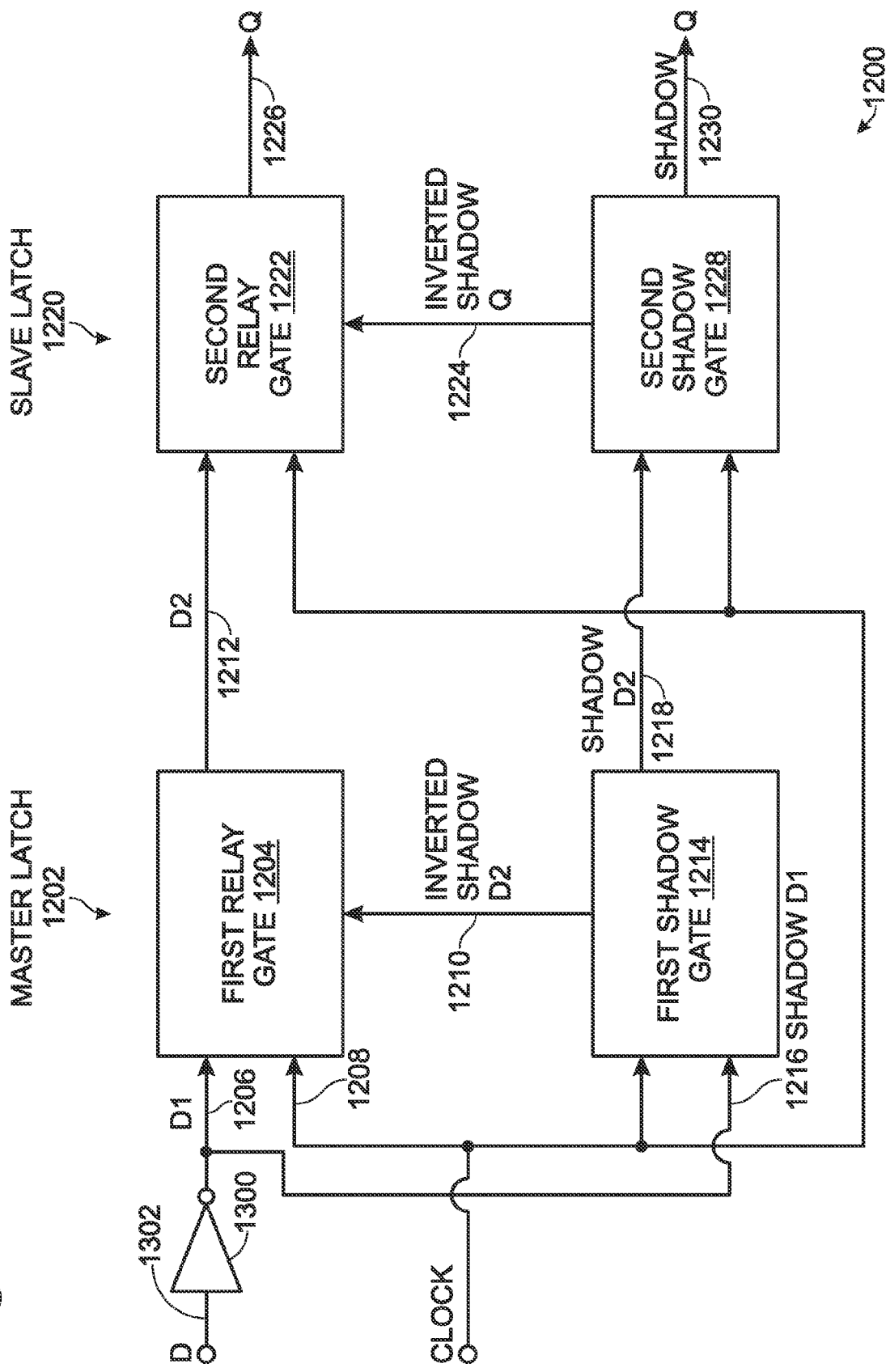

FIGS. 13A and 13B are schematic block diagrams depicting the HFML-FF of FIG. 12 with an additional signal inversion. In FIG. 13A the master latch 1202 further includes a first inverter 1300 having an input on line 1302 to accept an input D signal with a binary value, and having an output to supply the D1 signal to the first relay gate on line 1206. A second inverter 1304 has an input on line 1302 to accept the input D signal, and has an output on line 1216 to supply the shadow-D1 signal to the first shadow gate. In FIG. 13B the first inverter 1300 has an input on line 1302 to accept an input D signal with a binary value, and has an output on line 1206 to supply the D1 signal to the first relay gate and the shadow-D1 signal to the first shadow gate. That is, line 1206 and 1216 are the same line.

FIG. 14 is a schematic block diagram depicting the HFML-FF of FIG. 12 enabled using clocked pass gates. The first relay gate 1204 includes a first clocked pass gate circuit (CPGC) having an input on line 1206 to accept the D1 signal, an input on line 1208 to accept the clock signal, and an output on line 1212 to supply the D2 signal in a master latch pass mode. The D2 signal has a binary value equal to the D1 binary value. A third inverter 1402 accepts the inverted shadow-D2 signal on line 1210 having a binary value equal to an inverse of the shadow-D2 signal binary value, and supplies a slave D2 signal on line 1404 having a binary value equal to the D2 signal binary value. A second clocked pass gate circuit 1406 has an input on line 1404 to accept the slave D2 signal, an input on line 1208 to accept the clock signal, and an output to supply the D2 signal on line 1212 in a master latch hold mode.

The first shadow gate 1214 includes a third clocked pass gate circuit 1408 having an input on line 1216 to accept the shadow-D1 input signal, an input on line 1208 to accept the clock signal, and an output to supply the shadow-D2 signal on line 1218 in the master latch pass mode. A fourth inverter 1410 has an input on line 1218 to accept the shadow-D2 signal and an output on line 1210 to supply the inverted shadow-D2 signal. A fifth inverter 1412 has an input on line 1210 to accept the inverted shadow-D2 signal and an output on line 1414 to supply a shadow slave D2 signal having a binary value equal to the D2 signal binary value. A fourth clocked pass gate circuit 1416 has an input on line 1414 to accept the shadow slave D2 signal, an input on line 1208 to accept the clock signal, and an output to supply the shadow D2 signal on line 1218 in the master latch hold mode.

The second relay gate 1222 includes a fifth clocked pass gate circuit 1418 having an input on line 1212 to accept the D2 signal, an input on line 1208 to accept the clock signal, and an output on line 1226 to supply the Q signal in a slave latch pass mode. The Q signal has a binary value equal to the D2 binary value. A sixth inverter 1420 accepts the inverted shadow-Q signal on line 1224 having a binary value equal to an inverse of the shadow-Q signal, and supplies a slave Q signal on line 1422 with a binary value equal to the Q signal binary value. A sixth clocked pass gate circuit 1424 has an input on line 1422 to accept the slave Q signal, an input on line 1208 to accept the clock signal, and an output on line 1226 to supply the Q signal in a slave latch hold mode.

The second shadow gate 1228 includes a seventh clocked pass gate circuit 1426 having an input to accept the selected D2 input signal. As shown, a shadow D2 signal is accepted on line 1218. Alternatively, the D2 signal on line 1212 may be accepted. The seventh clocked pass gate circuit 1426 has an input on line 1208 to accept the clock signal, and an output on line 1230 to supply the shadow-Q signal in the slave latch pass mode. A seventh inverter 1428 has an input on line 1230 to accept the shadow-Q signal and an output to supply the inverted shadow-Q signal on line 1224. An eighth inverter 1430 has an input on line 1224 to accept the inverted shadow-Q signal and an output on line 1432 to supply a shadow slave Q signal having a binary value equal to the Q signal binary value. An eighth clocked pass gate circuit 1434 has an input on line 1332 to accept the shadow slave Q signal, an input on line 1208 to accept the clock signal, and an output on line 1230 to supply the shadow-Q signal in the slave latch hold mode.

Figure 15:
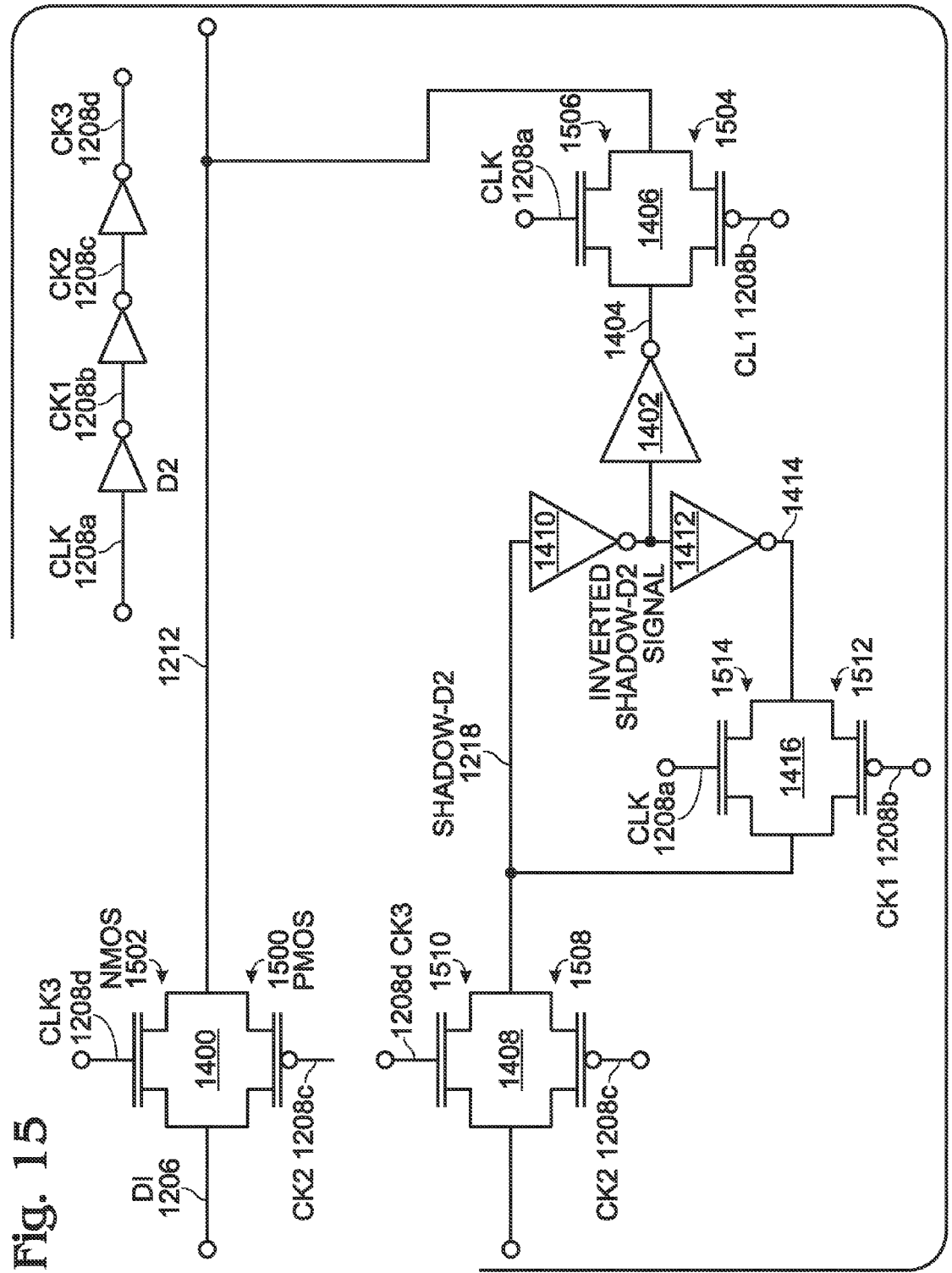
FIG. 15 is a more detailed depiction of the master latch of FIG. 14.

FIG. 15 is a more detailed depiction of the master latch of FIG. 14. The first clocked pass gate 1400 includes a first PMOS field effect transistor (FET) 1500 having a first source/drain (S/D) connected to the D1 input signal on line 1206, a second S/D connected to supply the D2 signal on line 1212, and a gate connected to receive a second clock signal (CK2) on line 1208c having the same binary value as a clock signal (CLK) 1208a and with a second delay with respect to CLK. A first NMOS FET 1502 has a first S/D connected to the first S/D of the first PMOS FET 1500, a second S/D connected to the second S/D of the first PMOS FET, and a gate to receive a third clock signal (CK3) on line 1208d equal to an inverted CLK binary value, and with a third delay with respect to CLK, greater than the second delay.

The second clocked pass gate circuit 1502 includes a second PMOS FET 1504 having a first S/D connected to receive the slave D2 signal on line 1404, a second S/D to supply the D2 signal on line 1212, and a gate connected to receive a first clock signal (CK1) on line 1208b equal to the inverted CLK binary value, and with a first delay with respect to CLK, less than the second delay. A second NMOS FET 1506 has a first S/D connected to the first S/D of the second PMOS FET 1504, a second S/D connected to the second S/D of the second PMOS FET, and a gate to receive CLK on line 1208a.

The third clocked pass gate circuit 1408 includes a third PMOS FET 1508 having a first SD connected to the shadow D1 signal on line 1216, a second S/D connected to supply the shadow-D2 signal on line 1218, and a gate connected to receive CK2 on line 1208c. A third N'MOS FET 1510 has a first S/D connected to the first S/D of the third PMOS FET 1508, a second S/D connected to the second S/D of the third PMOS FET, and a gate to receive CK3 on line 1208d. The fourth clocked pass gate circuit 1416 includes a fourth PMOS FET 1512 having a first S/D connected to receive the shadow slave D2 signal on line 1414, a second S/D to supply the shadow-D2 signal on line 1218, and a gate connected to receive CK1. A fourth NMOS FET 1514 has a first S/D connected to the first S/D of the fourth PMOS FET 1512, a second S/D connected to the second S/D of the fourth PMOS FET, and a gate to receive CLK on line 1208a.

Figure 16:
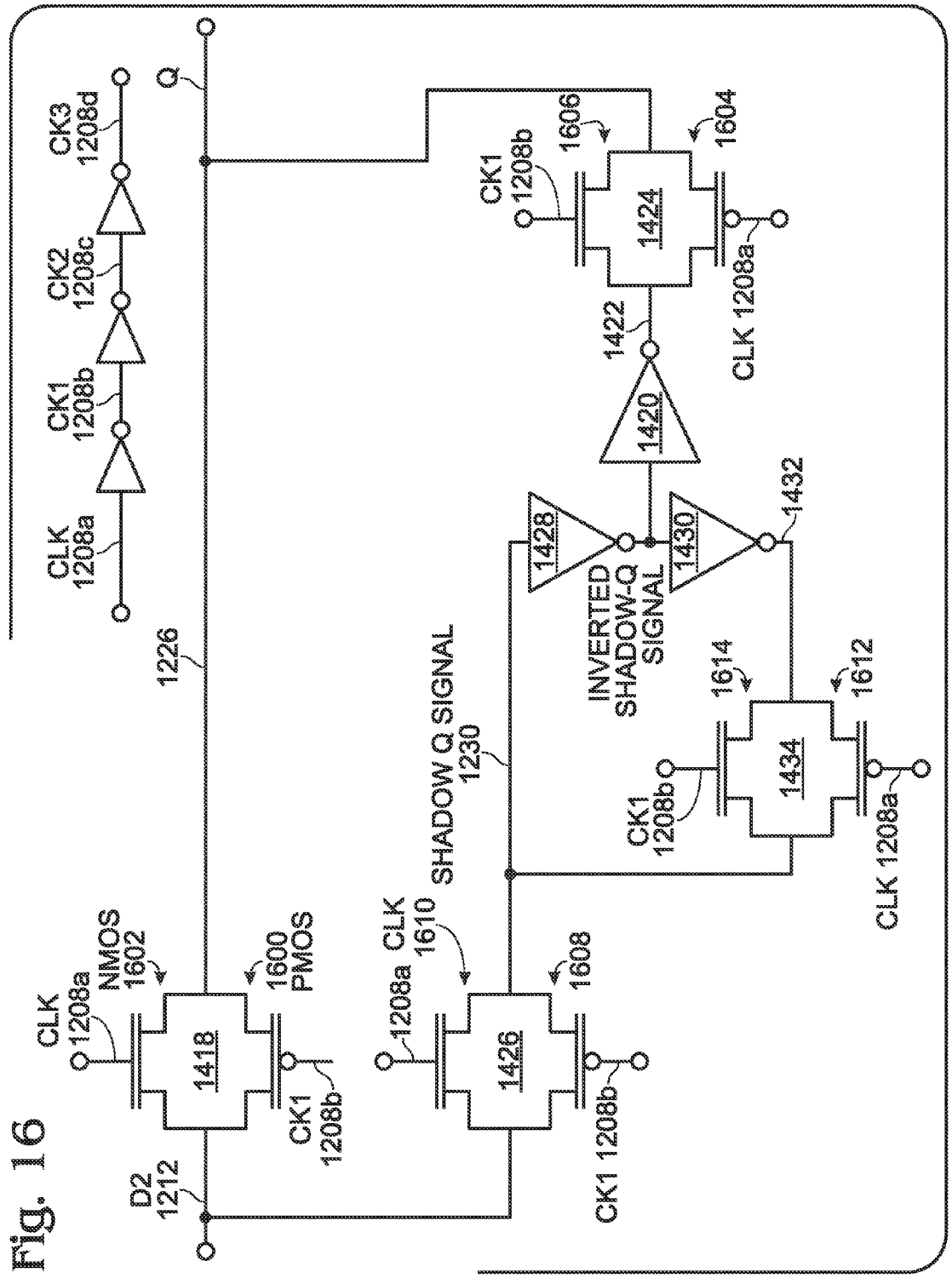
FIG. 16 is a more detailed depiction of the slave latch of FIG. 14.

FIG. 16 is a more detailed depiction of the slave latch of FIG. 14. The fifth clocked pass gate circuit 1418 includes a fifth PMOS FET 1600 having a first source/drain (S/D) connected to the D2 input signal on line 1212, a second S/D connected to supply the Q signal on line 1226, and a gate connected to receive CK1 on line 1208b. A fifth NMOS FET 1602 has a first S/D connected to the first S/D of the fifth PMOS FET 1600, a second S/D connected to the second S/D of the fifth PMOS FET, and a gate to receive CLK on line 1208a. The sixth clocked pass gate circuit 1424 includes a sixth PMOS FET 1604 having a first S/D connected to receive the slave Q signal on line 1422, a second S/D to supply the Q signal on line 1226, and a gate connected to receive CLK on line 1208a. A sixth NMOS FET 1606 has a first S/D connected to the first S/D of the sixth PMOS FET 1604, a second S/D connected to the second S/D of the sixth PMOS FET, and a gate to receive CK1 on line 1208b.

The seventh clocked pass gate circuit 1426 includes a seventh PMOS FET 1608 having a first SD connected to the selected D2 signal, In this case, the D2 signal is supplied on line 1212. The seventh clocked pass gate 1425 also includes a second S/D connected to supply the shadow-Q signal on line 1230, and a gate connected to receive CK1 on line 1208b. A seventh NMOS FET 1610 has a first S/D connected to the first S/D of the seventh PMOS FET 1608, a second S/D connected to the second S/D of the seventh PMOS FET, and a gate to receive CLK on line 1208a. The eighth clocked pass gate circuit 1434 includes an eighth PMOS FET 1612 having a first S/D connected to receive the shadow slave Q signal on line 1432, a second S/D to supply the shadow-Q signal on line 1230, and a gate connected to receive CLK on line 1208a. An eighth NMOS FET 1614 has a first S/D connected to the first S/D of the eighth PMOS FET 1612, a second S/D connected to the second S/D of the eighth PMOS FET, and a gate to receive CK1 on line 1208b.

Figure 17:
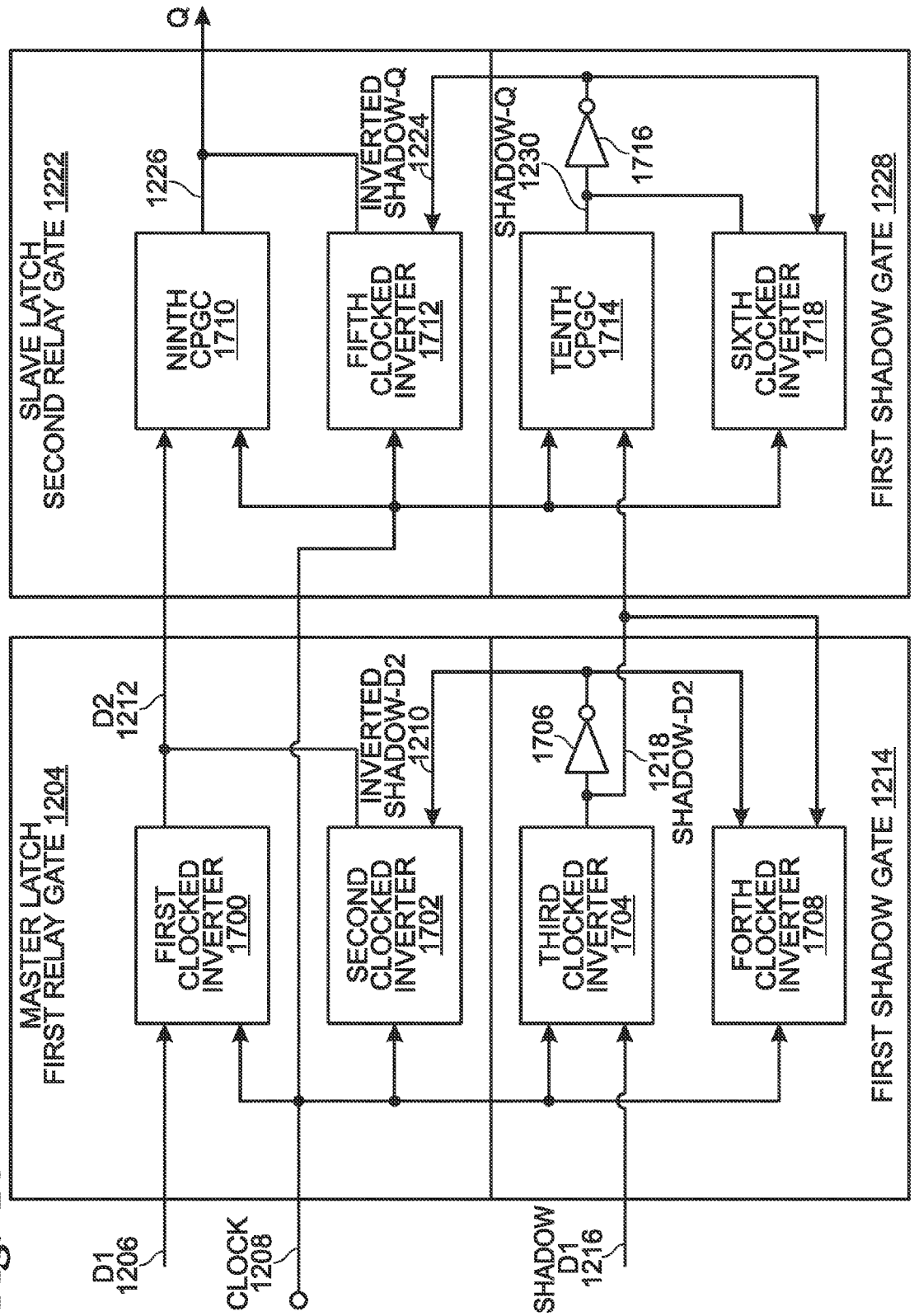
FIG. 17 is a schematic block diagram depicting the HFML-FF of FIG. 12 enabled using clocked inverters.

FIG. 17 is a schematic block diagram depicting the HFML-FF of FIG. 12 enabled using clocked inverters. In this aspect the first relay gate 1204 includes a first clocked inverter circuit 1700 having an input on line 1206 to accept the D1 signal, an input on line 1208 to accept the clock signal, and an output on line 1212 to supply the D2 signal in a master latch pass mode, where the D2 signal has a binary value equal to an inverted D1 signal binary value. A second clocked inverter circuit 1702 has an input to accept an inverted shadow-D2 signal (line 1210) with a binary value equal to an inverse of the D2 signal binary value, an input on line 1208 to accept the clock signal, and an output on line 1212 to supply the D2 signal in a master latch hold mode.

The first shadow gate 1214 includes a third clocked inverter circuit 1704 having an input on line 1216 (alternatively but not shown, line 1206) to accept the shadow-D1 signal, an input on line 1208 to accept the clock signal, and an output on line 1218 to supply the shadow-D2 signal in the master latch pass mode. A ninth inverter 1706 has an input on line 1218 to accept the shadow-D2 signal and an output on line 1210 to supply the inverted shadow-D2 signal. A fourth clocked inverter circuit 1708 has an input on line 1210 to accept the inverted shadow-D2 signal, an input on line 1208 to accept the clock signal, and an output on line 1218 to supply the shadow-D2 signal in the master latch hold mode.

The second relay gate 1222 includes a ninth clocked pass gate circuit 1710 having an input on line 1212 to accept the D2 input signal, an input on line 1208 to accept the clock signal, and an output on line 1226 to supply the Q signal in the slave latch pass mode, where the Q signal has a binary value equal to the D2 signal binary value. A fifth clocked inverter circuit 1712 has an input on line 1224 to accept the inverted shadow-Q signal with a binary value equal to an inverse of the Q signal binary value, an input oil line 1208 to accept the clock signal, and an output to supply the Q signal on line 1226 in a slave latch hold mode.

The second shadow gate 1228 includes a tenth clocked pass gate circuit 1714 having an input to accept the selected D2 input signal. As shown, the D2 signal is supplied on line 1218, but alternatively it could be supplied on line 1212. The tenth clocked pass gate circuit 1714 has an input on line 1208 to accept the clock signal, and an output on line 1230 to supply the shadow-Q signal in the slave latch pass mode. A tenth inverter 1716 has an input on line 1230 to accept the shadow-Q signal and an output on line 1224 to supply the inverted shadow-Q signal. A sixth clocked inverter circuit 1718 has an input on line 1224 to accept the inverted shadow-Q signal, an input on line 1208 to accept the clock signal, and an output on line 1230 to supply the shadow-Q signal in the slave latch hold mode.

Figure 18:
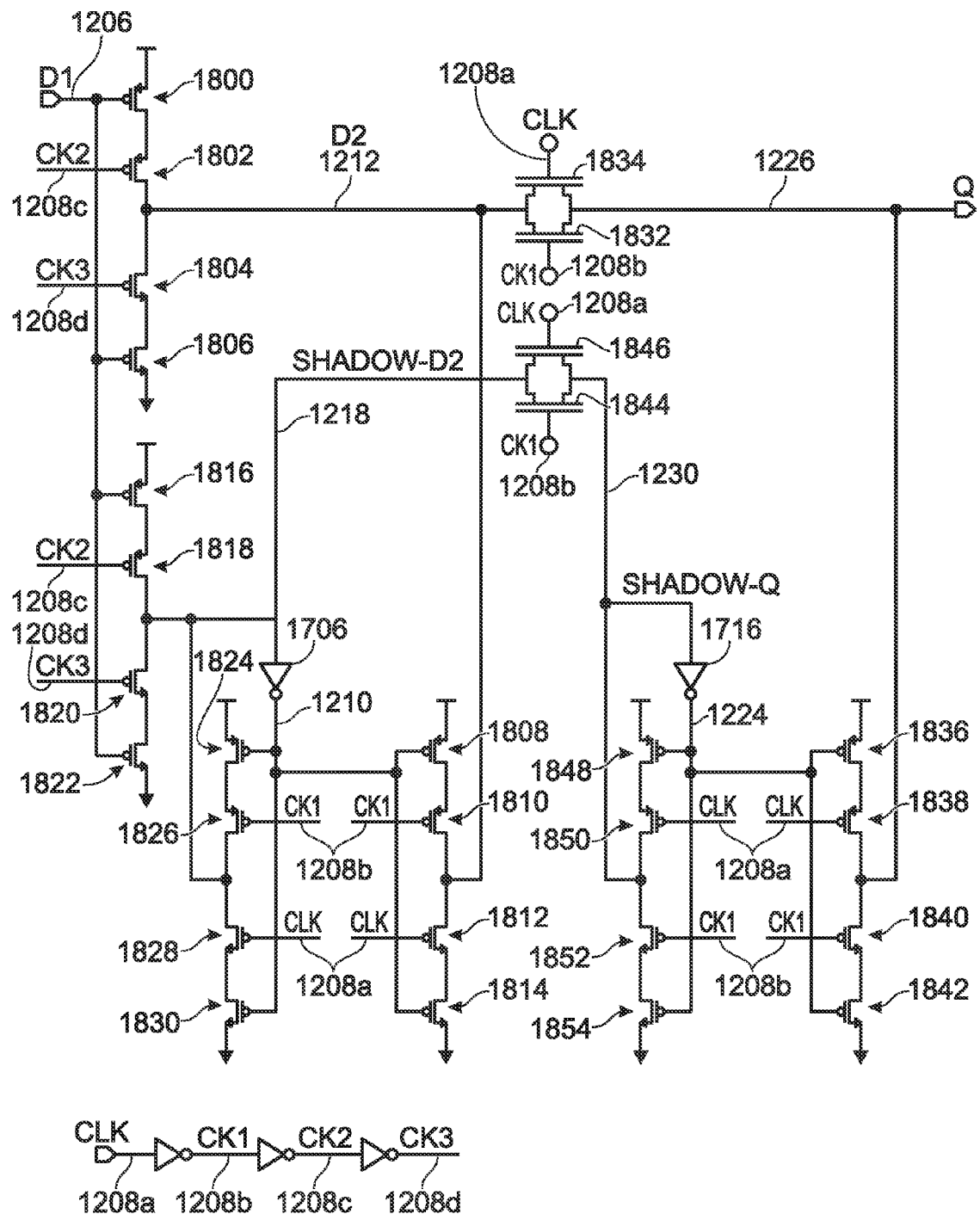
FIG. 18 is a schematic drawing depicting details of the HFML-FF circuit of FIG. 17.

FIG. 18 is a schematic drawing depicting details of the HFML-FF circuit of FIG. 17. The first clocked inverter circuit includes a ninth PMOS FET 1800 having a first S/D connected to a first dc reference voltage, a second S/D, and a gate connected to receive the D1 signal on line 1206. A tenth PMOS FET 1802 has a first S/D connected to the second S/D of the ninth PMOS FET 1800, a second S/D to supply the D2 signal on line 1212, and a gate to receive CK2 on line 1208c. A ninth NMOS FET 1804 has a first S/D connected to the second S/D of the tenth PMOS FET 1802, a second S/D, and a gate to receive CK3 on line 1208d. A tenth NMOS FET 1806 has a first S/D connected to the second S/D of the ninth NMOS FET 1804, a second S/D connected to a second dc reference voltage having a lower potential than the first dc reference voltage, and a gate to accept the D1 signal on line 1206.

The second clocked inverter includes an eleventh PMOS FET 1808 has a first S/D connected to the first dc reference voltage, a second S/D, and a gate connected to receive the inverted shadow-D2 signal on line 1210. A twelfth PMOS FET 1810 has a first S/D connected to the second S/D of the eleventh PMOS FET 1808, a second S/D to supply the D2 signal on line 1212, and a gate to receive CK1 on line 1208b. An eleventh NMOS FET 1812 has a first S/D connected to the second S/D of the twelfth PMOS FET 1810, a second S/D, and a gate to receive CLK on line 1208a. A twelfth NMOS FET 1814 has a first S/D connected to the second S/D of the eleventh NMOS FET 1812, a second S/D connected to the second dc reference voltage, and a gate to accept the inverted shadow-D2 signal on line 1210.

The third clocked inverter circuit includes a thirteenth PMOS FET 1816 having a first S/D connected to a first dc reference voltage, a second S/D, and a gate connected to receive the shadow-D1 signal. Here the shadow-D1 is shown supplied on line 1206. Alternatively, the shadow-D1 signal may be supplied on line 1216 (see FIG. 12). A fourteenth PMOS FET 1818 has a first S/D connected to the second S/D of the thirteenth PMOS FET 1816, a second S/D to supply the shadow-D2 signal on line 1218, and a gate to receive CK2 on line 1208c. A thirteenth NMOS FET 1820 has a first S/D connected to the second S/D of the fourteenth PMOS FET 1818, a second S/D, and a gate to receive CK3 on line 1208d. A fourteenth NMOS FET 1822 has a first S/D connected to the second S/D of the thirteenth NMOS FET 1820, a second S/D connected to the second dc reference voltage, and a gate to accept the shadow-D1 signal on line 1206 (alternatively, line 1216).

The fourth clocked inverter includes an fifteenth PMOS FET 1824 having a first S/D connected to the first dc reference voltage, a second S/D, and a gate connected to receive the inverted shadow-D2 signal on line 1210. A sixteenth PMOS FET 1826 has a first S/D connected to the second S/D of the fifteenth PMOS FET 1824, a second S/D to supply the shadow-D2 signal on line 1218, and a gate to receive CK1 on line 1208b. A fifteenth NMOS FET 1828 has a first S/D connected to the second S/D of the sixteenth PMOS FET 1826, a second S/D, and a gate to receive CLK on line 1208a. A sixteenth NMOS FET 1830 has a first S/D connected to the second S/D of the fifteenth NMOS FET 1828, a second S/D connected to the second dc reference voltage, and a gate to accept the inverted shadow-D2 signal on line 1210.

The ninth clocked pass gate circuit includes a seventeenth PMOS FET 1832 having a first source/drain (S/D) connected to the D2 input signal on line 1212, a second S/D connected to supply the Q signal on line 1226, and a gate connected to receive CK1 on line 1208b. A seventeenth NMOS FET 1834 has a first S/D connected to the first S/D of the seventeenth PMOS FET 1832, a second S/D connected to the second S/D of the seventeenth PMOS FET, and a gate to receive CLK on line 1208a.

The fifth clocked inverter includes an eighteenth PMOS FET 1836 having a first S/D connected to the first dc reference voltage, a second S/D, and a gate connected to receive the inverted shadow-Q signal on line 1224. A nineteenth PMOS FET 1838 has a first S/D connected to the second S/D of the eighteenth PMOS FET 1836, a second S/D to supply the Q signal on line 1226, and a gate to receive CLK on line 1208*a*. An eighteenth NMOS FET 1840 has a first S/D connected to the second S/D of the nineteenth PMOS FET 1838, a second S/D, and a gate to receive CK1 on line 1208*b*. A nineteenth NMOS FET 1842 has a first S/D connected to the second S/D of the eighteenth NMOS FET 1840, a second S/D connected to the second dc reference voltage, and a gate to accept the inverted shadow-Q signal on line 1210.

The tenth clocked pass gate circuit includes a twentieth PMOS FET 1844 having a first SD connected to the selected D2 signal (as shown, line 1218), a second S/D connected to supply the shadow-Q signal on line 1230, and a gate connected to receive CK1 on line 1208*b*. A twentieth NMOS FET 1846 has a first S/D connected to the first S/D of the twentieth PMOS FET 1844, a second S/D connected to the second S/D of the twentieth PMOS FET, and a gate to receive CLK on line 1208*a*.

The sixth clocked inverter includes a twenty-first PMOS FET 1848 having a first S/D connected to the first dc reference voltage, a second S/D, and a gate connected to receive the inverted shadow-Q signal on line 1224. A twenty-second PMOS FET 1850 has a first S/D connected to the second S/D of the twenty-first PMOS FET 1848, a second S/D to supply the shadow-Q signal on line 1230, and a gate to receive CLK on line 1208*a*. A twenty-first NMOS FET 1852 has a first S/D connected to the second S/D of the twenty-second PMOS FET 1850, a second S/D, and a gate to receive CK1 on line 1208*b*. A twenty-second NMOS FET 1854 has a first S/D connected to the second S/D of the twenty-first NMOS FET 1852, a second S/D connected to the second dc reference voltage, and a gate to accept the inverted shadow-Q signal on line 1210.

Considering FIG. 16 and the master latch portion of FIG. 18, it can be seen that a hazard-free minimal-latency (HFML) latch is provided with a relay gate (first relay gate 1204) and a shadow gate (first shadow gate 1214). As described in detail above, the relay gate 1204 has an input on line 1206 to accept a D1 signal with a binary value, an input to accept a clock signal (CLK) on line 1208*a*, a first clock signal (CK1) on line 1208*b*, a second clock signal (CK2) on line 1208*c*, and a third clock signal (CK3) on line 1208*d*. The relay gate 1204 has an input to accept an inverted shadow-D2 signal on line 1210, and an output to supply a D2 signal with a binary value on line 1212. The shadow gate 1214 has an input to accept the D1 signal on either line 1206 or 1216, an input to accept CLK, CK1, CK2, and CK3, and an output to supply the inverted shadow-D2 signal on line 1210.

Details of the relay gate and shadow gate enabled using either clocked inverter circuits or clocked pass gate circuits have been provided in detail above, and are not repeated here in the interest of brevity.

Note: designs equivalent to the above-described positive edge-triggered circuits can be enabled as a falling edge-triggered latch or flip-flop by reversing the clock polarities.

Figure 19:
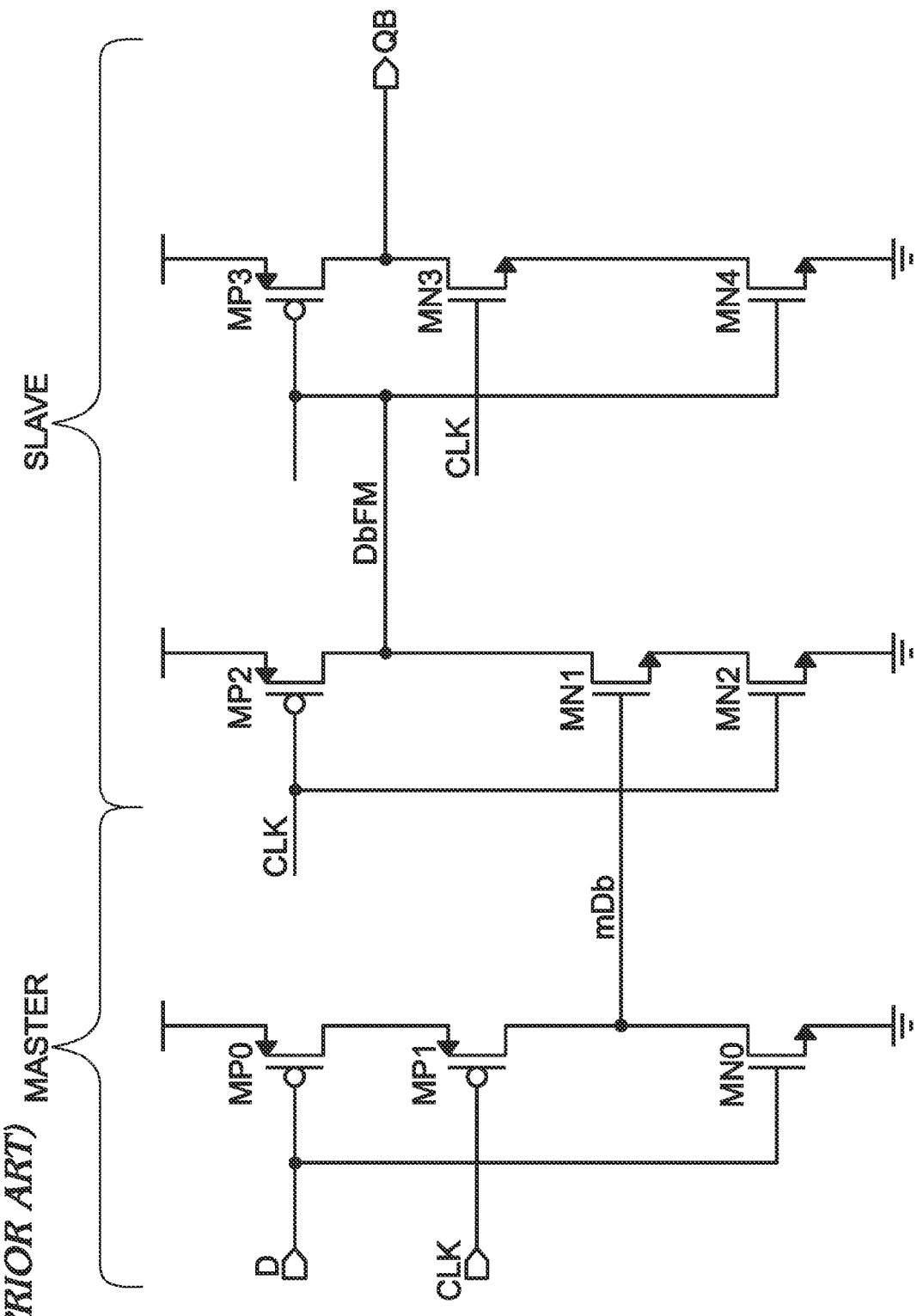
FIG. 19 is a schematic drawing of a positive edge-triggered true single-phase clocking (TSPC) flip-flop (prior art).
Figure 20:
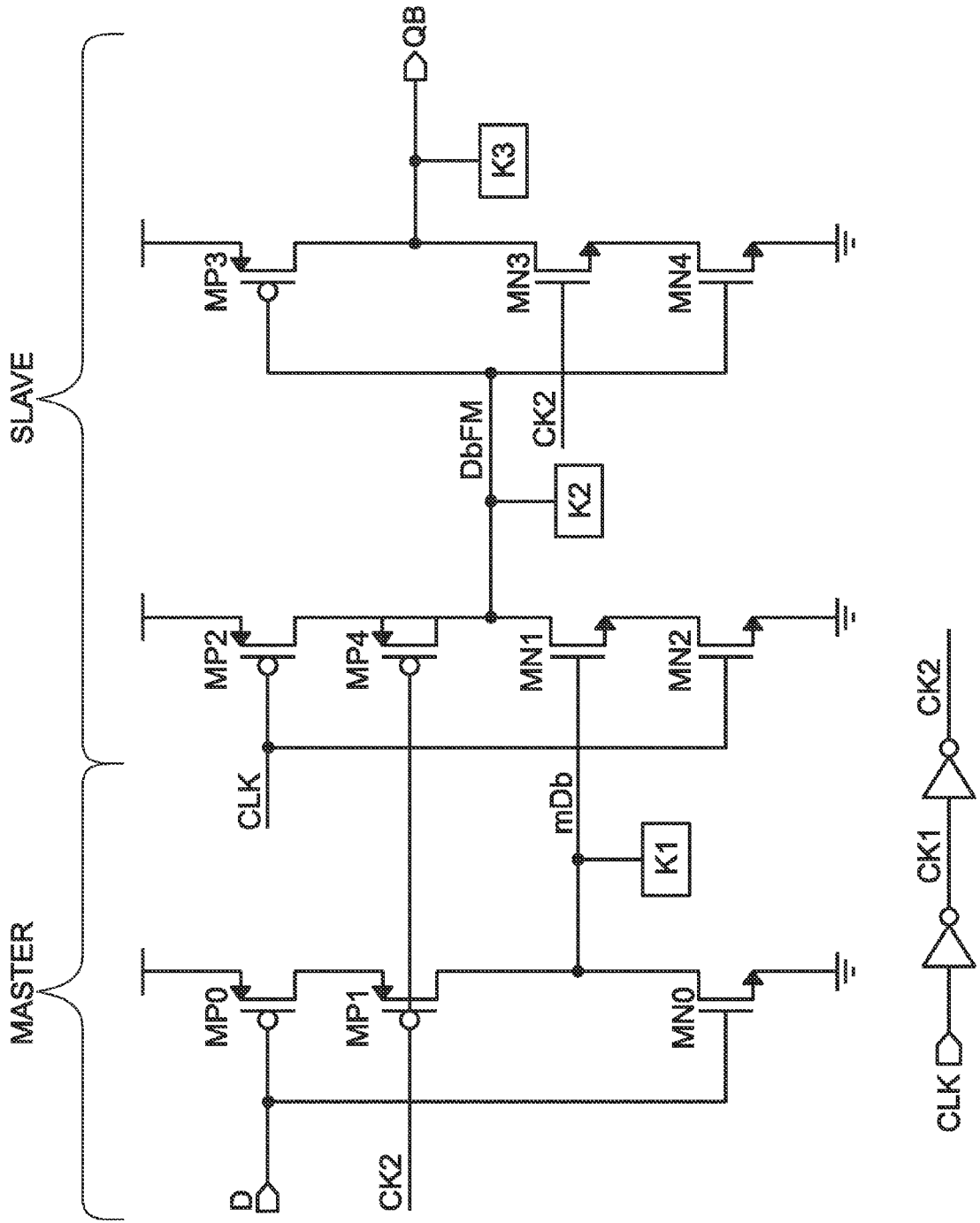
FIG. 20 is a schematic diagram of a pseudo single-phase flip-flop (PSP-FF).

FIG. 20 is a schematic diagram of a pseudo single-phase flip-flop (PSP-FF). The FF of FIG. 20 is a single-input positive edge-triggered flip-flop. Like TSPC-FF of FIG. 19, it comprises 3 stages with keepers placed at each stage. Keepers K1 and K2 are conventional structures. K3 is a keeper which incorporates the state node of the slave, but is designed to isolate the latter from output disturbances. Examples for K1 and K2, as well as the design of K3 are discussed below. Although a single-phase clock is globally distributed to all flip-flops, it is internally inverted and buffered in order to address the problems associated with TSPC-FF.

As seen in the figure, the first and last stages of the flip-flop are the same as those of TSPC except that they are gated not by CLK, but a delayed clock CK2. The second stage, i.e. the first stage of the slave, is also similar to that of TSPC except for an additional PMOS transistor, MP4, gated by CK2, and in series with MP2.

The operation of PSP-FF is similar to that of TSPC-FF except for the following:

The master does not become opaque on the rising edge of the clock but after two inversion delays, producing a soft boundary between the master and the slave.

The master does not become transparent on the falling edge of the clock but after two inversion delays, thus solving the internal race.

The slave does not become opaque on the falling clock edge but after two inversion delays. DbMF does not enter pre-charge till after CK2 falls and MP4 turns on.

The slave becomes transparent on the rising edge of the clock (MN2 turns on; MP2 turns off). However, the slave's second stage does not allow QB to transition low till after CK2 rises and MN3 turns on, thus equalizing clock-to-Q delay for both transitions. This topology, as discussed below, is faster than the TSPC-FF, and addresses the aforementioned problems of the latter.

Figure 21:
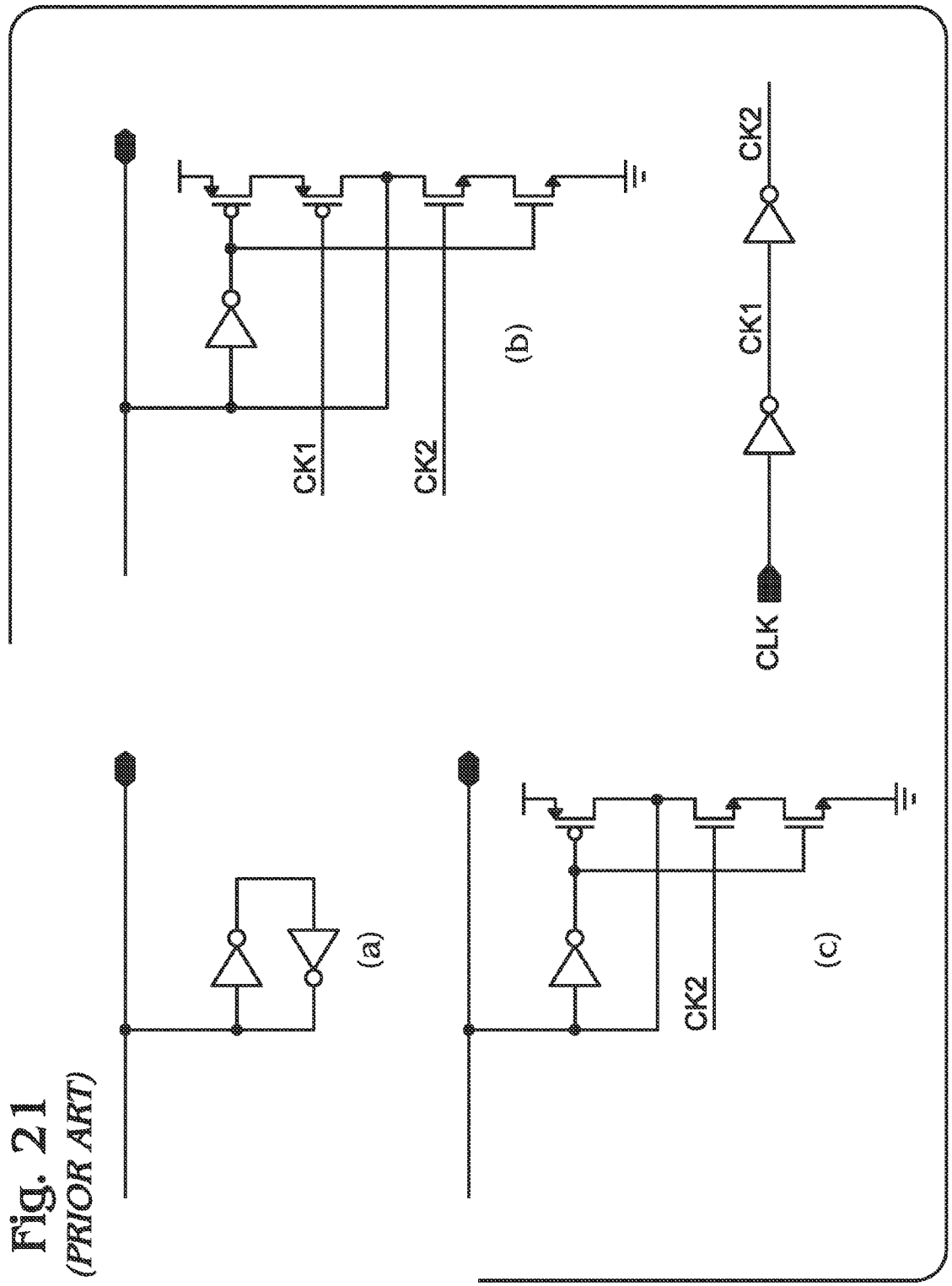
FIG. 21 is a schematic diagram depicting some examples of conventional keeper circuits (prior art).

FIG. 21 is a schematic diagram depicting some examples of conventional keeper circuits (prior art). The keepers eliminate "floating" or dynamic nodes. Keeper (a) is non-clocked and thus the feedback inverter must be sufficiently small so that its state may be overridden. Keeper (b) is fully-clocked and keeper (c) is partially-clocked. Clocked keepers favor weakly driven nodes.

As an example of usage, the PSP-FF master comprises the PMOS pull-up stack of MP0/MP1. It is desirable to have the keeper K1 pull-down disabled (clocked as in (c)) when the master is transparent and evaluating. This allows the master pull-up stack to be sized without any limitation imposed by the keeper pull-down.

In contrast to K1, which is needed to hold state at mDb when the master is opaque, K2 is necessary when the slave is transparent. K2 can be implemented using any of the keepers of FIG. 21. If mDb is low when clock rises, DbMF stays high and held by the keeper pull-up. The keeper pull-down is needed because the master pull-down is not clocked and thus mDb can transition low after the flip-flop hold-time is met, leaving DbMF at a high-impedance, dynamic low-state. Keeper (c) is preferred over (a) as its pull-down is turned off when clock falls facilitating the pre-charge of DbMF.

Figure 22A:
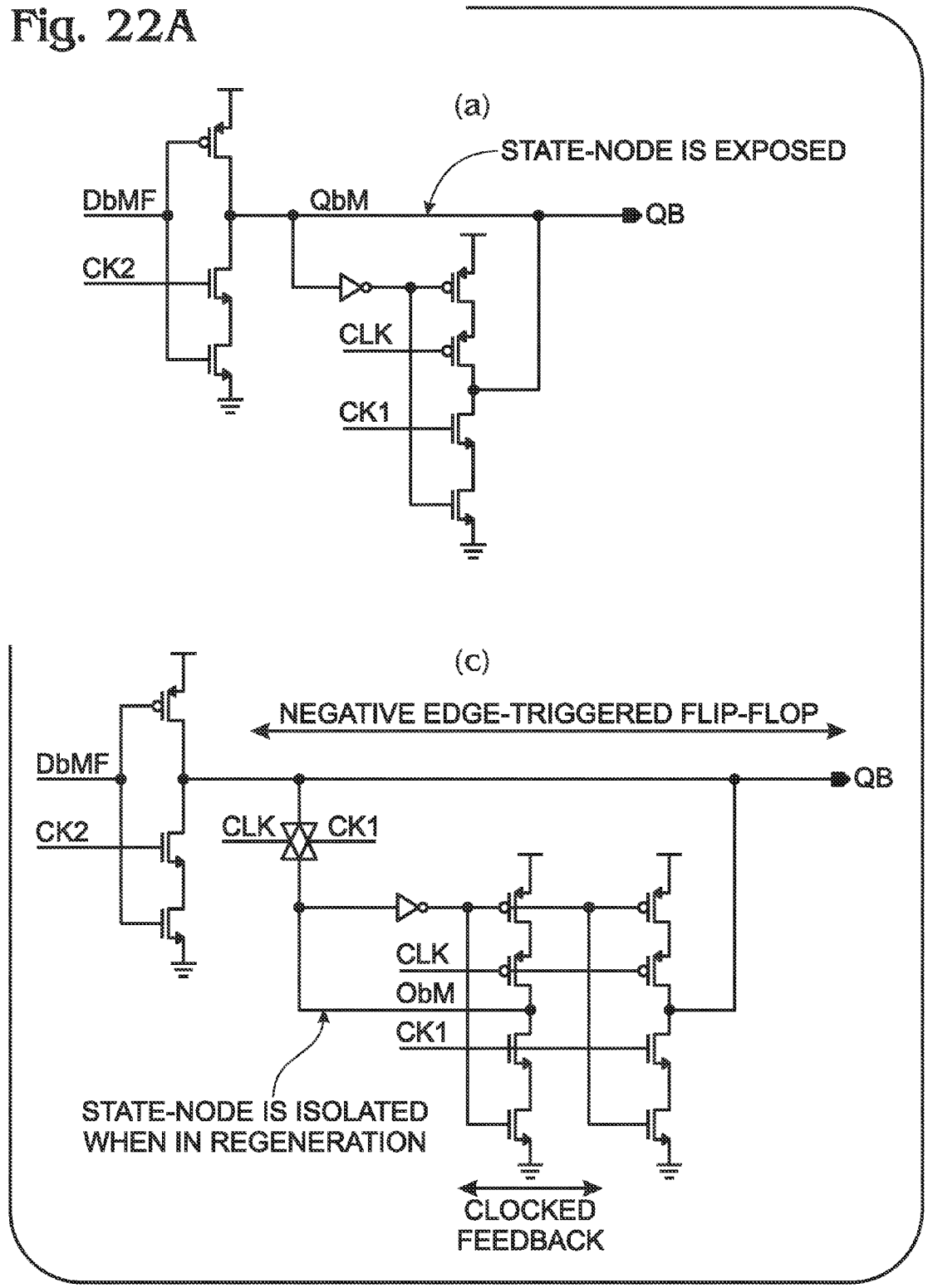
FIGS. 22A and 22B are schematics depicting examples contrasting isolated and exposed state nodes.
Figure 22B:
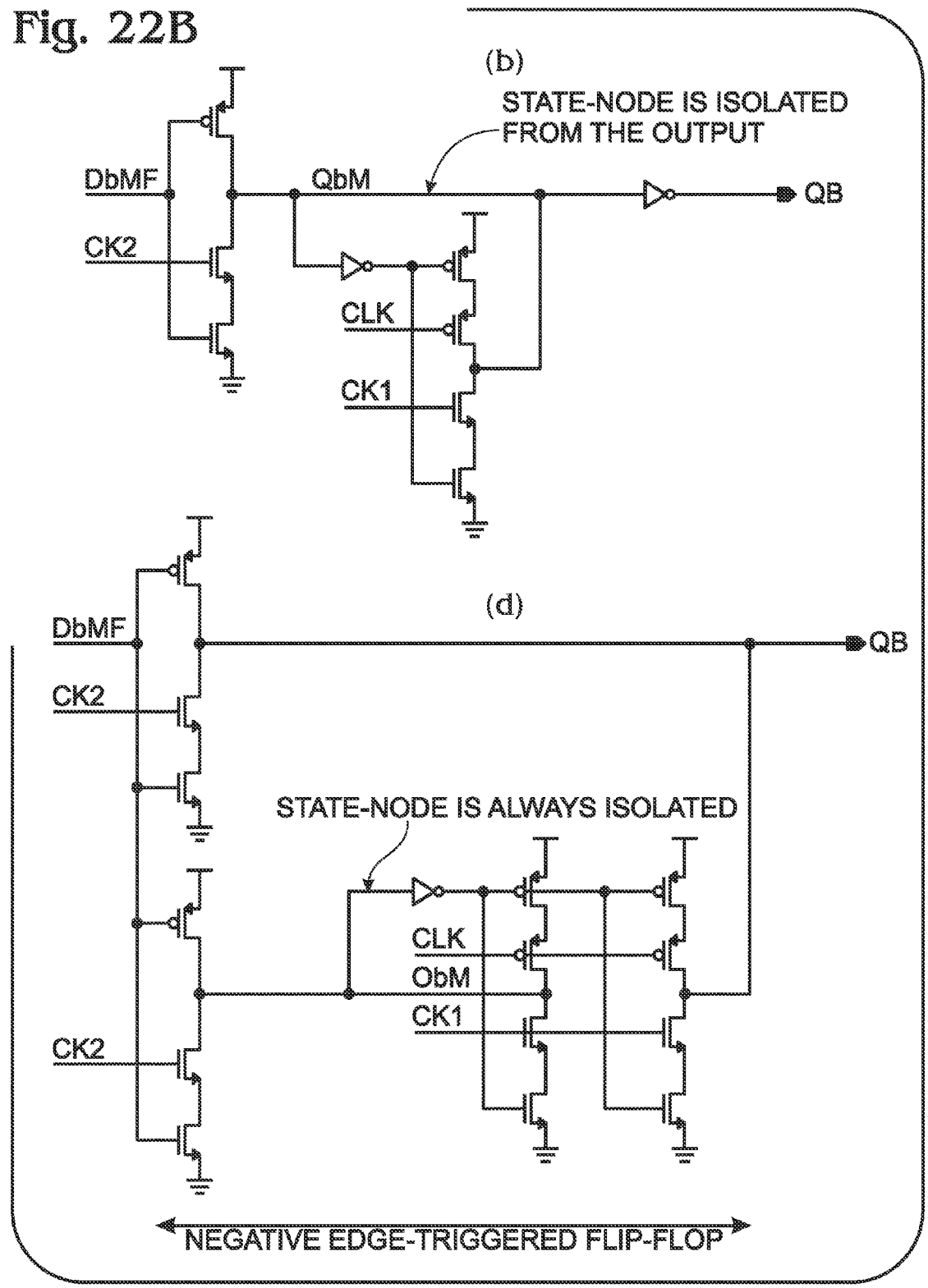

FIGS. 22A and 22B are schematics depicting examples contrasting isolated and exposed state nodes. The industry standard flip-flop never exposes the state node to the external environment. Circuit (a) depicts an example of an exposed state-node using the PSP-FF slave stage. During the low phase of the clock, the slave is opaque, and the clocked keeper drives QB. Depending on its state, high-down (QB=1) or low-up (QB=0) coupling to this node can alter its state due to the regenerative action of the keeper. Therefore, incurring a penalty of 20 to 30% in latency, the state-node is buffered, an example of which is shown for PSP-FF slave in circuit (b).

Circuit (c) illustrates the inclusion of an additional pass-gate and a clocked feedback while stripping the buffer when compared to circuit (b). The former isolates the state-node during the low phase of the clock when the keeper is driving QB. A cursory observation of the isolated keeper proves it to be a negative edge-triggered flip-flop with a dynamic output. Circuit (d) shows a slightly different variation of the isolated keeper, named as a shadow keeper. It can be seen that the keeper is functionally a negative edge-triggered flip-flop with a dynamic output.

While in (c) the keeper input and output are tied together at QB, shadow keeper is driven by the previous stage, DbMF, which makes its state-node isolated from the output in both clock phases. Although the shadow keeper maybe slightly safer than (c), its respective flip-flop is somewhat slower as its input loads DbMF as opposed to (c) input loading QB.

It should be noted that the driving ability of keepers (c) and (d) is compromised due to pass-gates at their outputs. One aspect, as shown in FIG. 24 and described below, is implemented such that the keeper output comprises single—and not stacked—P and N transistors thus eliminating the aforementioned drive strength problem.

Figure 23:
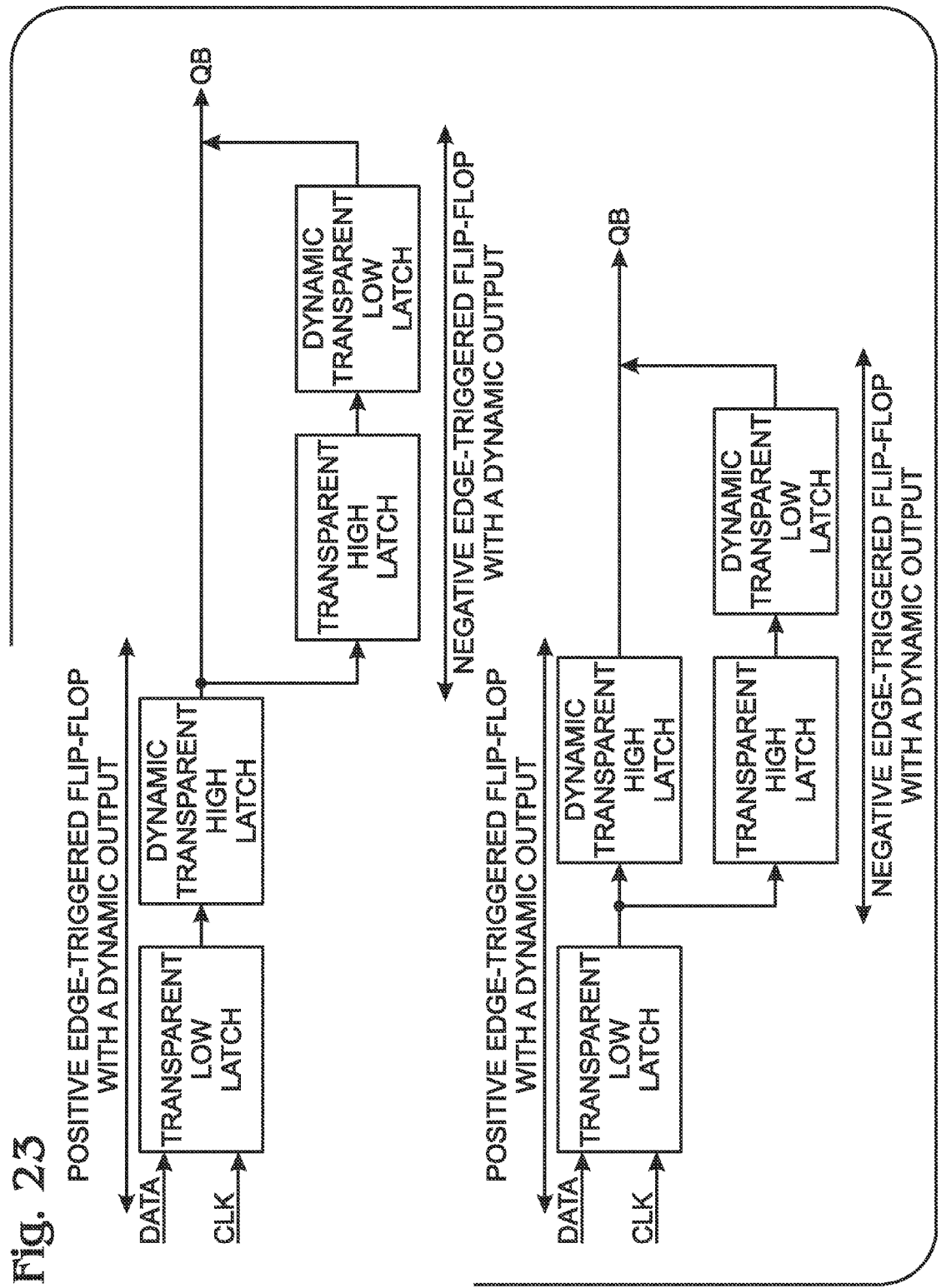
FIG. 23 is a schematic block diagram depicting negative edge-triggered flip-flops with dynamic outputs.

FIG. 23 is a schematic block diagram depicting negative edge-triggered flip-flops with dynamic outputs. In general, as applied to all flip-flops, it can be said that a positive edge-triggered flip-flop can have an un-buffered dynamic output if it is coupled to a negative edge-triggered flip-flop whose input is driven either by the output of the master or the slave of the former.

Figure 24:
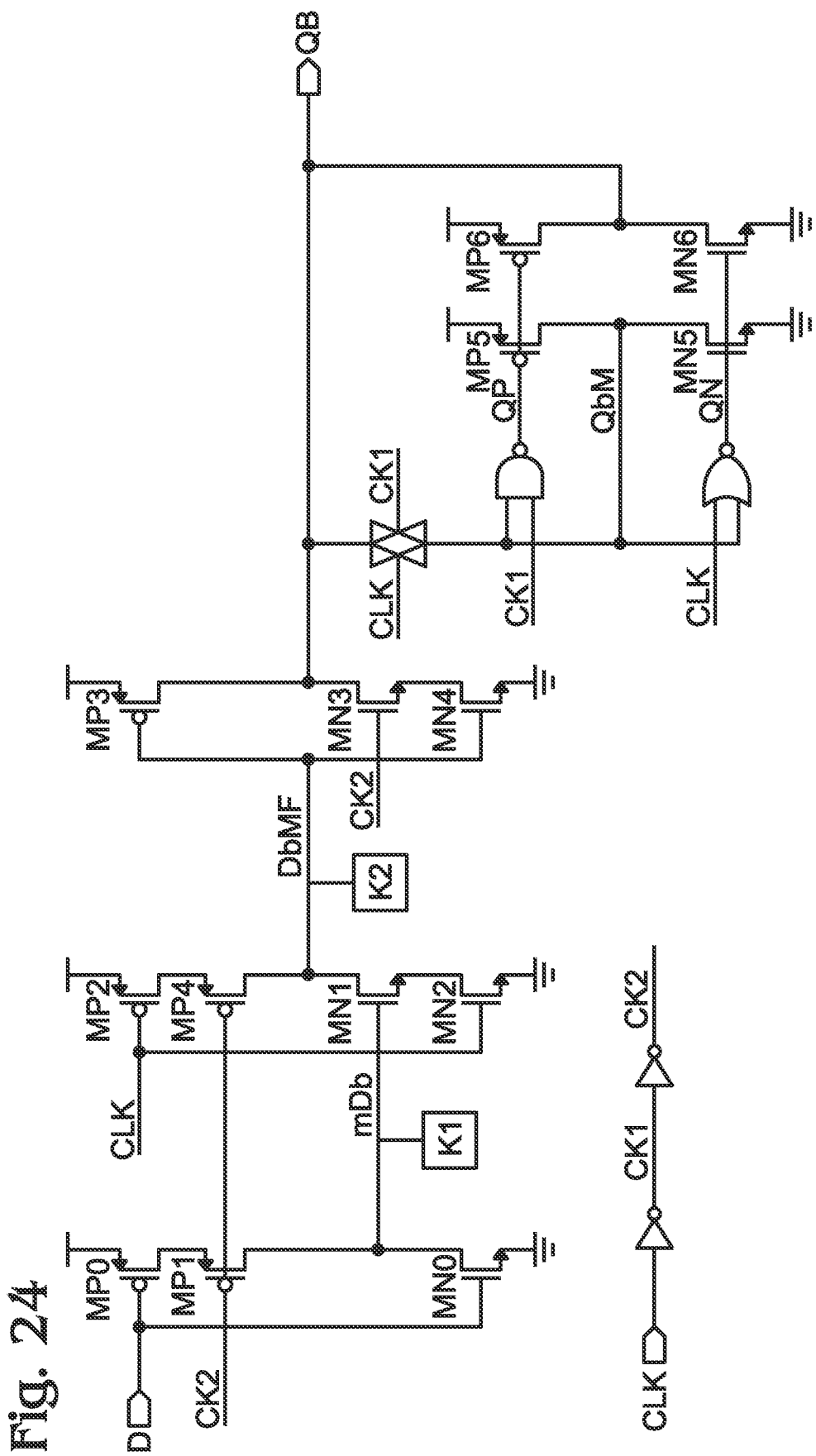
FIG. 24 illustrates a PSP-FF including an illustrative embodiment of the isolated output keeper.

FIG. 24 illustrates a PSP-FF including an illustrative embodiment of the isolated output keeper. QB is driven hard in both clock phases and is at no time, even briefly, in high impedance. The state node, QbM, is driven when the clock is high, and decoupled from the output when the clock is low and the keeper is regenerative. The keeper originates from, and ends at, QB and comprises a pass-gate followed by a tri-state buffer. When clock is high, the flop slave is transparent and the pass-gate is enabled. Thus, both QB and QbM are driven hard by the slave. At the same time, the tri-state buffer, with outputs QB and QbM, is disabled (QP=1, QN=0). When clock falls, both the slave and the pass-gate become opaque. Concurrently, the tri-state buffer is activated. If QbM samples a "1" on the falling clock edge, the NAND discharges QP to ground turning transistors MP5 and MP6 on. If QbM is samples a "0", the NOR drives QN to Vdd turning transistors MN5 and MN6 on.

In both cases, transistors MP6 and MN6, which form the keeper output, drive the same logical value throughout the low phase that was being driven by the slave in the high-phase of the clock. At the same time, the NAND and NOR gates, together with MP5 and MN5, form a regenerative feedback holding QbM at the level sampled on the falling clock edge.

Figure 25:
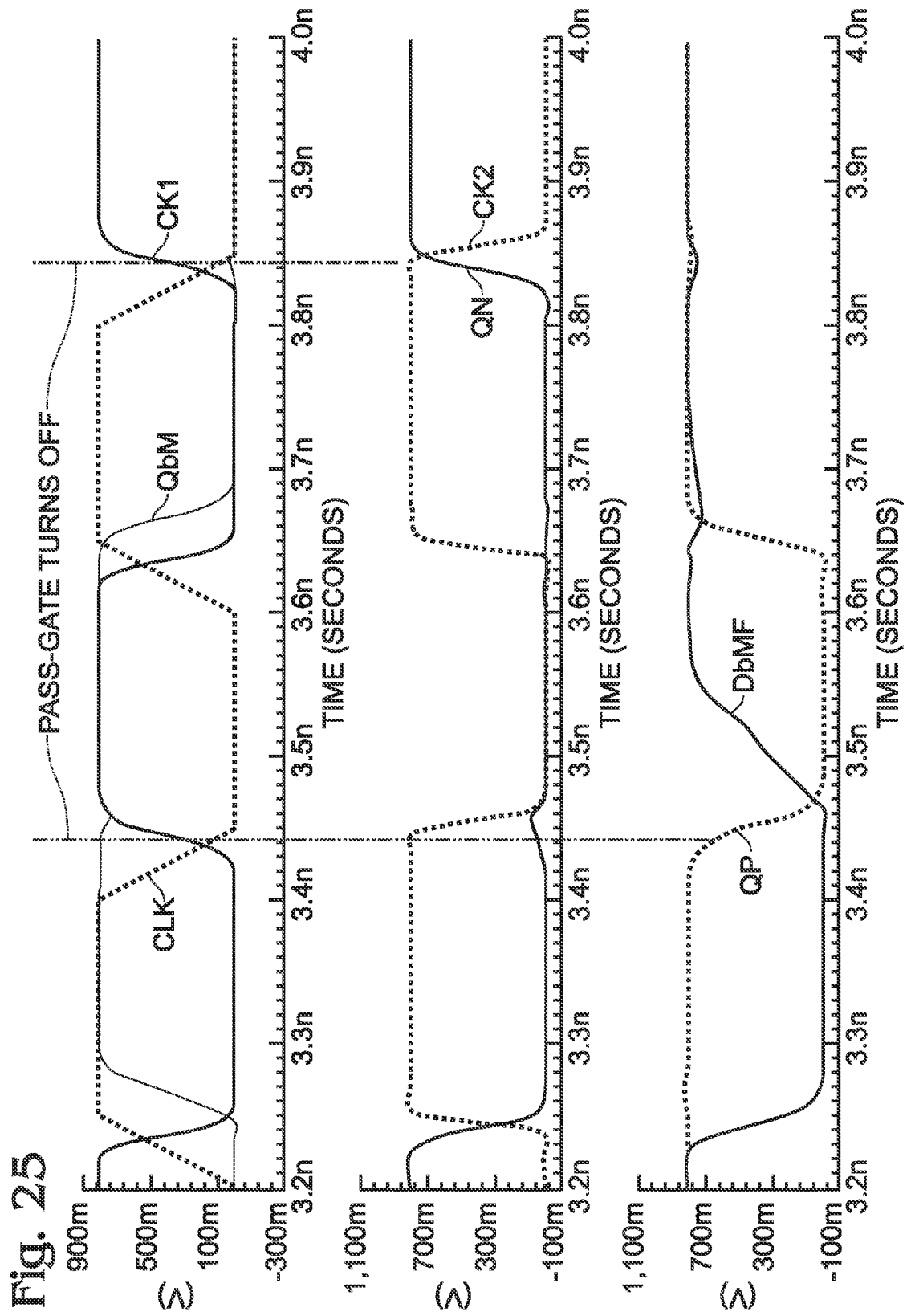
FIG. 25 is a timing diagram showing the waveforms controlling the flip-flop slave (DbMF, CK2) and the keeper output (QP, QN).

FIG. 25 is a timing diagram showing the waveforms controlling the flip-flop slave (DbMF, CK2) and the keeper output (QP, QN). As seen, on the falling edge of the clock, and depending on the data, QP falls before DbMF rises, or QN rises before CK2 falls, ensuring sufficient overlap between driving circuits, slave and keeper, on the falling edge of the clock. In summary, QB is driven hard throughout the full clock cycle. Furthermore, the pass-gate at the input of the keeper turns off before the slave becomes opaque, and the keeper is held regeneratively when it is its turn to drive QB.

With respect to clock slope sensitivity and internal race conditions, on the falling edge of the clock, MN2, gated by CLK, turns off before MP1, gated by the buffered clock, CK2, turns on, eliminating the race between the master and the slave. Responsive to CLK, CK2 falls; DbMF is pre-charged to Vdd turning MN4 on. Concurrently, MN3 turns off. Unlike TSPC-FF, which is sensitive to the raw clock falling edge causing a race between the two stages of the slave, CK2, internal to the PSP-FF has a controlled slew rate, eliminating the brief moment in time where both MN3 and MN4 are both on.

With respect to the $t_{CQ}$ imbalance between transitions and output glitch when data does not transition, output transitions with respect to the rising edge of the clock, $t_{CQ}$ 1→0 and $t_{CQ}$ 0→1 are equalized to roughly 2 inversion delays as the transition for the former commences only after CK2 rises. For the same reason, with D=0 for consecutive cycles, QB remains high and does not exhibit a low-going glitch.

Figure 26:
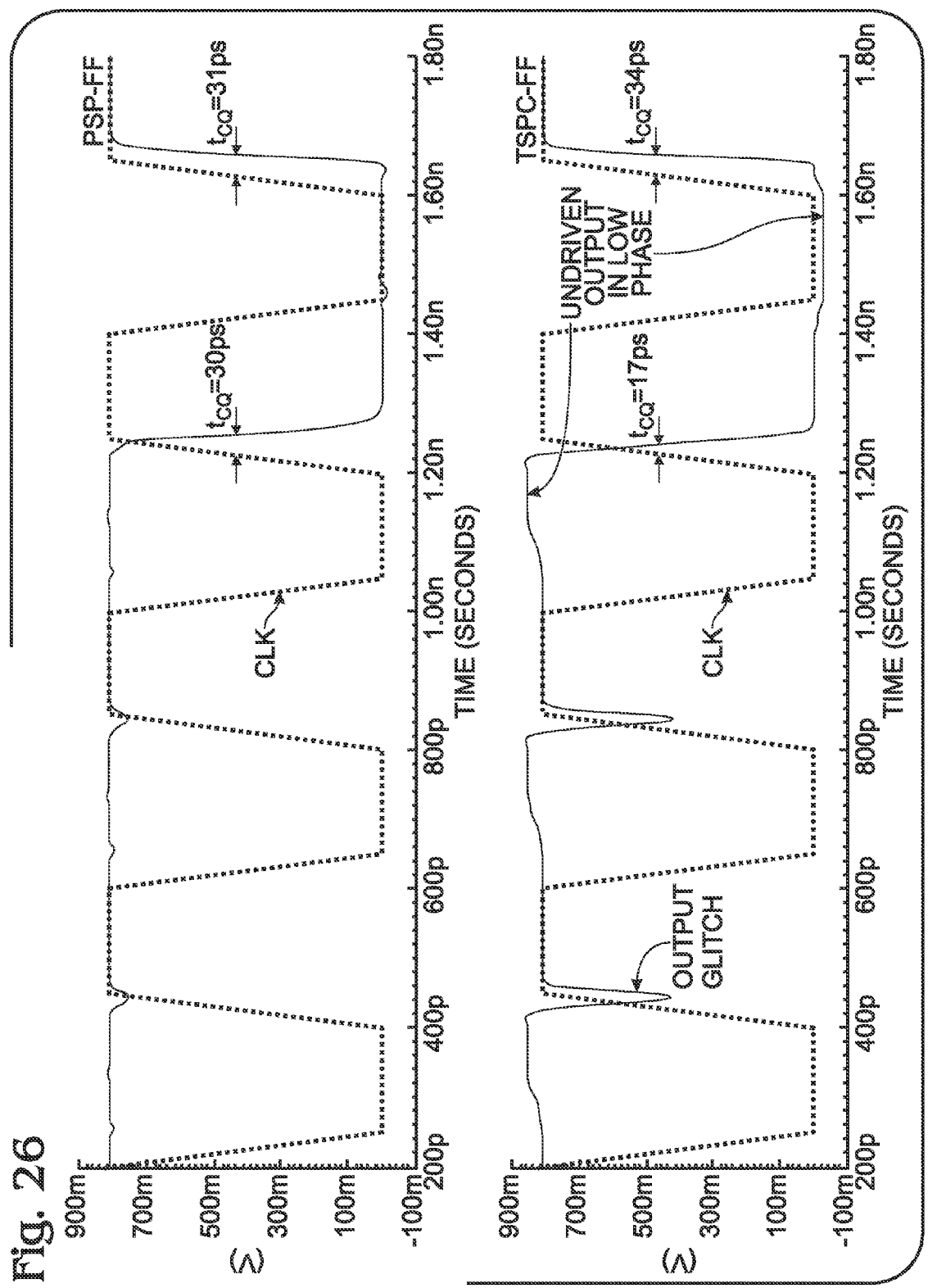
FIGS. 26 and 27 are timing diagrams showing a comparison of the clock-to-Q delays for TSPC-FF and PSP-FF for the 1→0, 0→1, and 1→1 output transitions.
Figure 27:
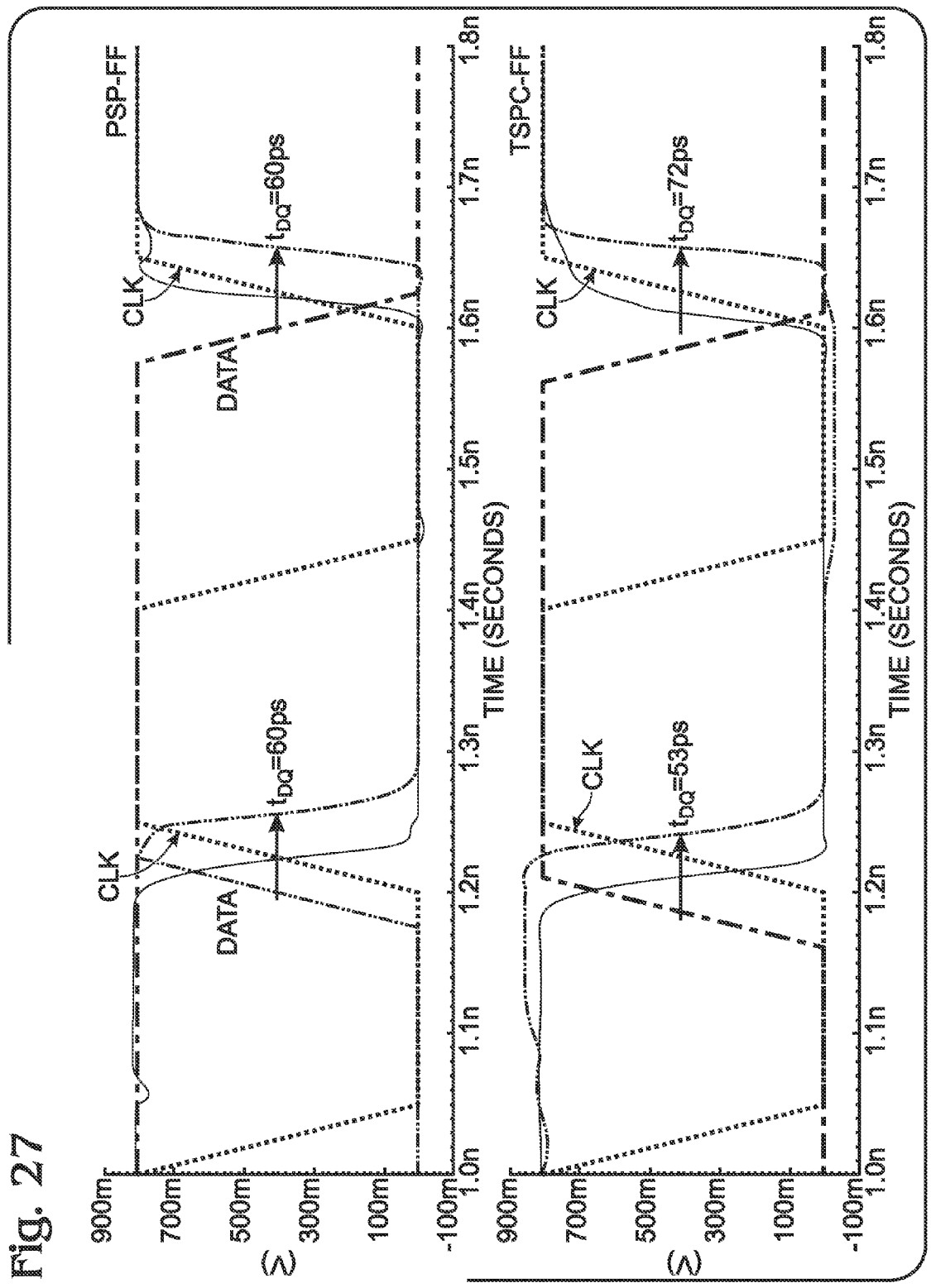

FIGS. 26 and 27 are timing diagrams showing a comparison of the clock-to-Q delays for TSPC-FF and PSP-FF for the 1→0, 0→1, and 1→1 output transitions. The $t_{CQ}$ imbalance (17 ps vs. 34 ps) exhibited by the former is absent in the latter (30 ps vs. 31 ps), and so is the pronounced output glitch for the 1→1 output transition, as well as, the high-up and low-down excursions of the "floating" output in the low-phase.

With respect to the clock load, in the case of TSPC-FF, the raw clock, CLK, drives MP1, MP2, MN2, and MN3 transistors. Except for the pre-charger MP2, these devices can be quite large so as to satisfy low latency, as well as an acceptable output edge rate. But for PSP-FF, CLK only drives MP2, and MN2- and a small inverter, I1, for generating the buffered clock variants, CK1 and CK2. As a result, the latter flip-flop can provide better drive capability and higher speed when having a comparable clock load to those of TSPC.

While the worst-case $t_{CQ}$ delays are similar for both flip-flops, PSP-FF has a much shorter $t_{SU}$ for the following reason (see FIG. 27): the boundary between its master and slave on the rising edge of the clock is soft, i.e. when the slave is activated, the master is still transparent and becomes opaque only after CK2 rises. In contrast, such a boundary for TSPC is hard, i.e. the master becomes opaque on the rising edge of CLK. Thus, data must rigidly set up to the rising clock edge.

Therefore, the PSP-FF $t_{DQ}$ delay is faster than that for TSPC-FF by roughly 20%. As described earlier, the maximum hold time for TSPC-FF relates to D=0 which is about 1 gate delay and is the same for PSP-FF. However the soft edge of the latter produces a 2 gate-delay hold time requirement for D=1; that is, data cannot transition low before CK2 rises; if it does, mDb rises and D=0 races through the flip-flop.

Figure 28:
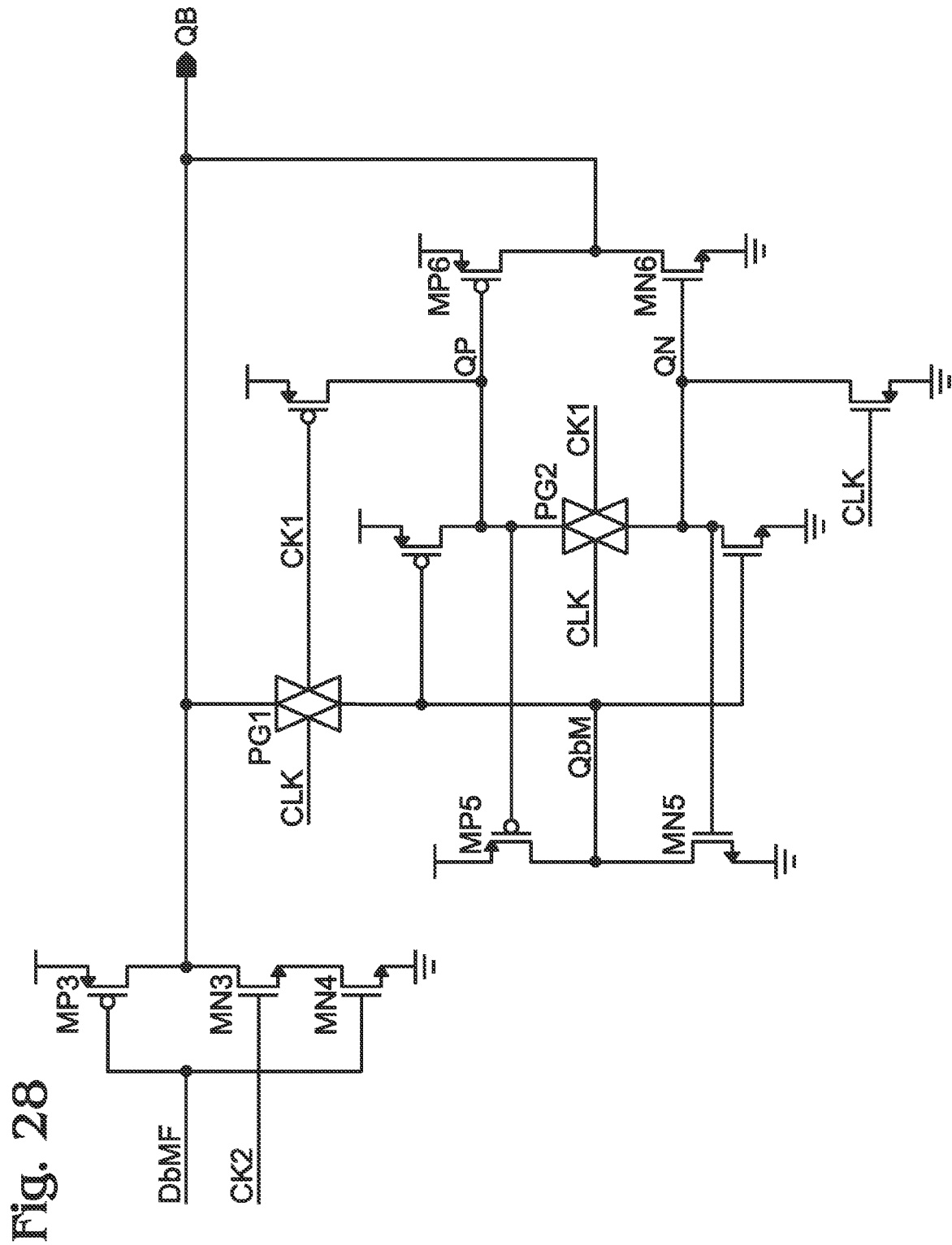
FIG. 28 depicts another embodiment of the isolated keeper.

FIG. 28 depicts another embodiment of the isolated keeper. As compared to that in FIG. 24, the tri-state buffer uses a different topology that is more compact. The following gives a brief description of its operation. During the high phase of the clock (CLK=1, CK1=0, CK2=1), the flip-flop slave is driving QB and QbM (PG1 is on), at the same time, PG2 is off; QP and QN are at VDD and ground respectively. Thus, the keeper driver comprising MP6/MN6, as well as the keeper feedback MP5/MN5, is off.

On the falling edge of the clock, PG turns off, and PG2 turns on allowing the transfer of the inverted value of QbM to nodes QP and QN. In response, the keeper output turns on and on the falling edge of CK2 the slave turns off. Thus, although both the slave and the keeper outputs are dynamically driven when separated on alternate clock phases, together there common output is always driven.

Figure 29:
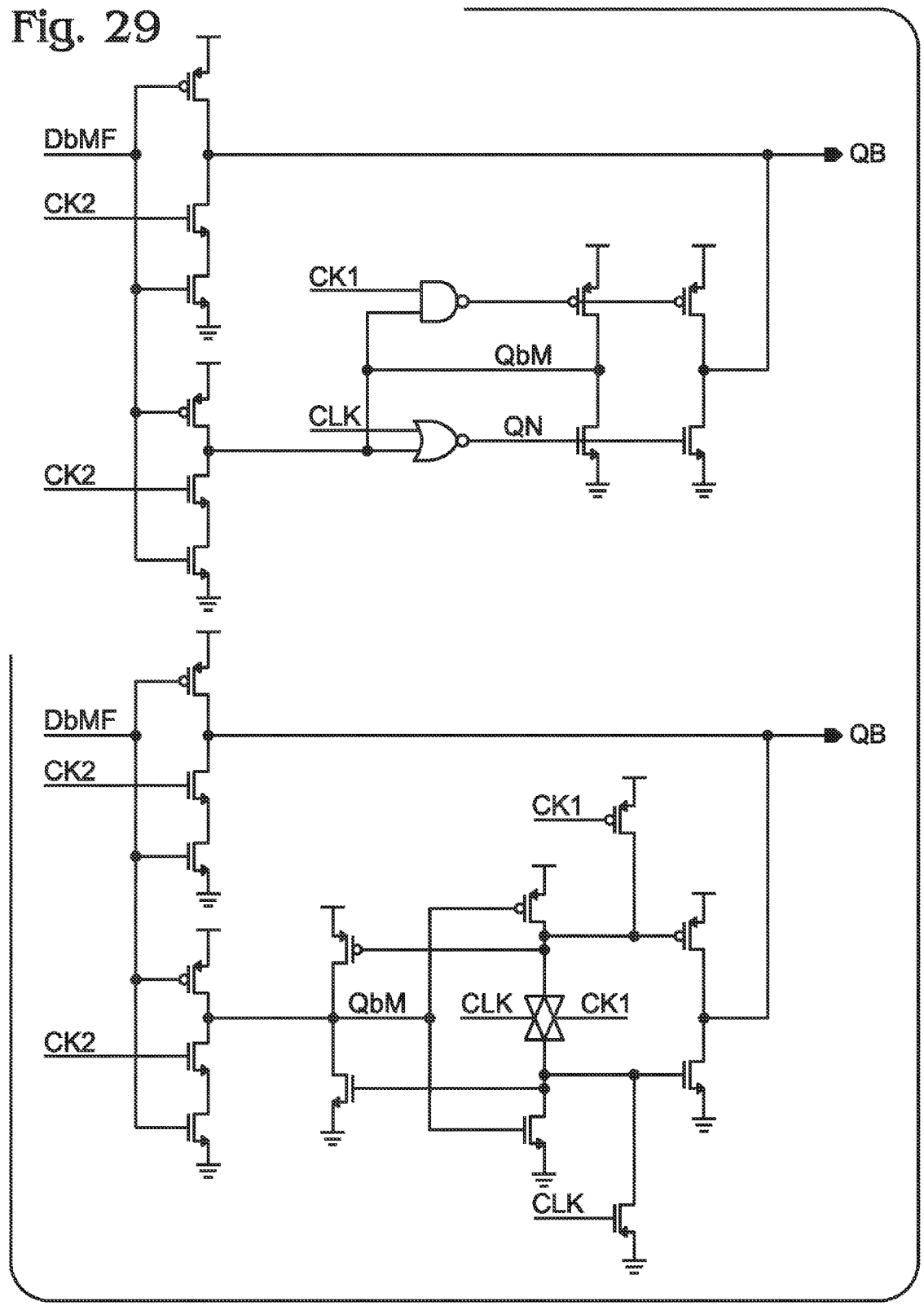
FIG. 29 are schematic diagrams depicting two tri-state buffer variations shown in FIGS. 24 and 28, as applied to the shadow keeper topology.

FIG. 29 are schematic diagrams depicting two tri-state buffer variations shown in FIGS. 24 and 28, as applied to the shadow keeper topology.

In summary, the PSP-FF can incorporate complex logic at virtually no impact to its latency because of its un-buffered output, thanks to the isolated keeper, and the monotonic nature of its slave stage. Assorted logic and routing wires can safely be placed directly at the QB output in place of a buffer which would have otherwise been necessary to protect the storage node. More important, logic can be integrated with a plurality of single-delay masters driving a plurality of NMOS pull-down transistors on the monotonic node of the slave.

A HFML-FF and HFML latch have been provided. Examples of particular clocked gating circuits and keepers have been presented to illustrate the invention. However, the invention is not limited to merely these examples. Other variations and embodiments of the invention will occur to those skilled in the art.

We claim:

1. A hazard-free minimal-latency flip-flop (HFML-FF) comprising:
   a master latch comprising:
   a first relay gate having an input to accept a D1 signal with a binary value, an input to accept a clock signal, an input to accept an inverted shadow-D2 signal, and an output to supply a D2 signal with a binary value equal to a shadow-D2 binary value, the first relay gate output supplied in response to the D1 signal, the inverted shadow-D2 signal, and the clock signal;
   a first shadow gate having an input to accept a shadow-D1 signal, an input to accept the clock signal, and an output to supply a shadow-D2 signal and the inverted shadow-D2 signal, the first shadow gate outputs supplied in response to the shadow-D1 signal and clock signal;
   a slave latch comprising:
   a second relay gate having an input to accept the D2 signal, an input to accept the clock signal, an input to accept an inverted shadow-Q signal, and an output to supply a Q signal with a binary value equal to the D1 and shadow-Q signal binary values, the second relay gate output supplied in response to the D2 signal, the inverted shadow-Q signal, and the clock signal; and,
   a second shadow gate having an input to accept a signal selected from a group consisting of the D2 signal and the shadow-D2 signal, an input to accept the clock signal, and an output to supply a shadow-Q signal and the inverted shadow-Q signal, the second shadow gate output supplied in response to the selected D2 signal and clock signal.

2. The HFML-FF of claim 1 wherein the master latch further comprises:
   a first inverter having an input to accept an input D signal with a binary value, and having an output to supply the D1 signal to the first relay gate and the shadow-D1 signal to the first shadow gate.

3. The HFML-FF of claim 1 wherein the master latch further comprises:
   a first inverter having an input to accept an input D signal with a binary value, and having an output to supply the D1 signal to the first relay gate; and,
   a second inverter having an input to accept the input D signal, and having an output to supply the shadow-D1 signal to the first shadow gate.

4. The HFML-FF of claim 1 wherein the first relay gate comprises:
   a first clocked pass gate circuit having an input to accept the D1 signal, an input to accept the clock signal, and an output to supply the D2 signal in a master latch pass mode, the D2 signal having a binary value equal to the D1 binary value;
   a third inverter to accept the inverted shadow-D2 signal having a binary value equal to an inverse of the shadow-D2 signal binary value, and supply a slave D2 signal having a binary value equal to the D2 signal binary value; and,
   a second clocked pass gate circuit having an input to accept the slave D2 signal, an input to accept the clock signal, and an output to supply the D2 signal in a master latch hold mode;
   wherein the first shadow gate comprises:
   a third clocked pass gate circuit having an input to accept the shadow-D1 input signal, an input to accept the clock signal, and an output to supply the shadow-D2 signal in the master latch pass mode;
   a fourth inverter having an input to accept the shadow-D2 signal and an output to supply the inverted shadow-D2 signal;
   a fifth inverter having an input to accept the inverted shadow-D2 signal and an output to supply a shadow slave D2 signal having a binary value equal to the D2 signal binary value; and,
   a fourth clocked pass gate circuit having an input to accept the shadow slave D2 signal, an input to accept the clock signal, and an output to supply the shadow D2 signal in the master latch hold mode.

5. The HFML-FF of claim 4 wherein the second relay gate comprises:
   a fifth clocked pass gate circuit having an input to accept the D2 signal, an input to accept the clock signal, and an output to supply the Q signal in a slave latch pass mode, the Q signal having a binary value equal to the D2 binary value;
   a sixth inverter to accept the inverted shadow-Q signal having a binary value equal to an inverse of the shadow-Q signal, and supply a slave Q signal with a binary value equal to the Q signal binary value; and,
   a sixth clocked pass gate circuit having an input to accept the slave Q signal, an input to accept the clock signal, and an output to supply the Q signal in a slave latch hold mode;
   wherein the second shadow gate comprises:
   a seventh clocked pass gate circuit having an input to accept the selected D2 input signal, an input to accept the clock signal, and an output to supply the shadow-Q signal in the slave latch pass mode;
   a seventh inverter having an input to accept the shadow-Q signal and an output to supply the inverted shadow-Q signal;
   an eighth inverter having an input to accept the inverted shadow-Q signal and an output to supply a shadow slave Q signal having a binary value equal to the Q signal binary value; and,
   an eighth clocked pass gate circuit having an input to accept the shadow slave Q signal, an input to accept the clock signal, and an output to supply the shadow-Q signal in the slave latch hold mode.

6. The HFML-FF of claim 4 wherein the first clocked pass gate circuit comprises:
   a first PMOS field effect transistor (FET) having a first source/drain (S/D) connected to the D1 input signal, a second S/D connected to supply the D2 signal, and a gate connected to receive a second clock signal (CK2) having the same binary value as a clock signal (CLK) and with a second delay with respect to CLK;
   a first NMOS FET having a first S/D connected to the first S/D of the first PMOS FET, a second S/D connected to the second S/D of the first PMOS FET, and a gate to receive a third clock signal (CK3) equal to an inverted CLK binary value, and with a third delay with respect to CLK, greater than the second delay;
   wherein the second clocked pass gate circuit comprises:
   a second PMOS FET having a first S/D connected to receive the slave D2 signal, a second S/D to supply the D2 signal, and a gate connected to receive a first clock signal (CK1) equal to the inverted CLK binary value, and with a first delay with respect to CLK, less than the second delay;

a second NMOS FET having a first S/D connected to the first S/D of the second PMOS FET, a second S/D connected to the second S/D of the second PMOS FET, and a gate to receive CLK;

wherein the third clocked pass gate circuit comprises:
a third PMOS FET having a first SD connected to the shadow D1 signal, a second S/D connected to supply the shadow-D2 signal, and a gate connected to receive CK2;
a third NMOS FET having a first S/D connected to the first S/D of the third PMOS FET, a second S/D connected to the second S/D of the third PMOS FET, and a gate to receive CK3;

wherein the fourth clocked pass gate circuit comprises:
a fourth PMOS FET having a first S/D connected to receive the shadow slave D2 signal, a second S/D to supply the shadow-D2 signal, and a gate connected to receive CK1;
a fourth NMOS FET having a first S/D connected to the first S/D of the fourth PMOS FET, a second S/D connected to the second S/D of the fourth PMOS FET, and a gate to receive CLK.

7. The HFML-FF of claim 6 wherein the fifth clocked pass gate circuit comprises:
a fifth PMOS FET having a first source/drain (S/D) connected to the D2 input signal, a second S/D connected to supply the Q signal, and a gate connected to receive CK1;
a fifth NMOS FET having a first S/D connected to the first S/D of the fifth PMOS FET, a second S/D connected to the second S/D of the fifth PMOS FET, and a gate to receive CLK;

wherein the sixth clocked pass gate circuit comprises:
a sixth PMOS FET having a first S/D connected to receive the slave Q signal, a second S/D to supply the Q signal, and a gate connected to receive CLK;
a sixth NMOS FET having a first S/D connected to the first S/D of the sixth PMOS FET, a second S/D connected to the second S/D of the sixth PMOS FET, and a gate to receive CK1;

wherein the seventh clocked pass gate circuit comprises:
a seventh PMOS FET having a first SD connected to the selected D2 signal, a second S/D connected to supply the shadow-Q signal, and a gate connected to receive CK1;
a seventh NMOS FET having a first S/D connected to the first S/D of the seventh PMOS FET, a second S/D connected to the second S/D of the seventh PMOS FET, and a gate to receive CLK;

wherein the eighth clocked pass gate circuit comprises:
an eighth PMOS FET having a first S/D connected to receive the shadow slave Q signal, a second S/D to supply the shadow-Q signal, and a gate connected to receive CLK;
an eighth NMOS FET having a first S/D connected to the first S/D of the eighth PMOS FET, a second S/D connected to the second S/D of the eighth PMOS FET, and a gate to receive CK1.

8. The HFML-FF of claim 1 wherein the first relay gate comprises:
a first clocked inverter circuit having an input to accept the D1 signal, an input to accept the clock signal, and an output to supply the D2 signal in a master latch pass mode, where the D2 signal has a binary value equal to an inverted D1 signal binary value;
a second clocked inverter circuit having an input to accept an inverted shadow-D2 signal with a binary value equal to an inverse of the D2 signal binary value, an input to accept the clock signal, and an output to supply the D2 signal in a master latch hold mode;

wherein the first shadow gate comprises:
a third clocked inverter circuit having an input to accept the shadow-D1 signal, an input to accept the clock signal, and an output to supply the shadow-D2 signal in the master latch pass mode;
a ninth inverter having an input to accept the shadow-D2 signal and an output to supply the inverted shadow-D2 signal; and,
a fourth clocked inverter circuit having an input to accept the inverted shadow-D2 signal, an input to accept the clock signal, and an output to supply the shadow-D2 signal in the master latch hold mode.

9. The HFML-FF of claim 8 wherein the second relay gate comprises:
a ninth clocked pass gate circuit having an input to accept the D2 input signal, an input to accept the clock signal, and an output to supply the Q signal in the slave latch pass mode, where the Q signal has a binary value equal to the D2 signal binary value;
a fifth clocked inverter circuit having an input to accept the inverted shadow-Q signal with a binary value equal to an inverse of the Q signal binary value, an input to accept the clock signal, and an output to supply the Q signal in a slave latch hold mode;

wherein the second shadow gate comprises:
a tenth clocked pass gate circuit having an input to accept the selected D2 input signal, an input to accept the clock signal, and an output to supply the shadow-Q signal in the slave latch pass mode;
a tenth inverter having an input to accept the shadow-Q signal and an output to supply the inverted shadow-Q signal; and,
a sixth clocked inverter circuit having an input to accept the inverted shadow-Q signal, an input to accept the clock signal, and an output to supply the shadow-Q signal in the slave latch hold mode.

10. The HFML-FF of claim 9 wherein the first clocked inverter circuit comprises:
a ninth PMOS FET having a first S/D connected to a first dc reference voltage, a second S/D, and a gate connected to receive the D1 signal;
a tenth PMOS FET having a first S/D connected to the second S/D of the ninth PMOS FET, a second S/D to supply the D2 signal, and a gate to receive CK2;
a ninth NMOS FET having a first S/D connected to the second S/D of the tenth PMOS FET, a second S/D, and a gate to receive CK3; and,
a tenth NMOS FET having a first S/D connected to the second S/D of the ninth NMOS FET, a second S/D connected to a second dec reference voltage having a lower potential than the first de reference voltage, and a gate to accept the D1 signal;

wherein the second clocked inverter comprises:
an eleventh PMOS FET having a first S/D connected to the first dc reference voltage, a second S/D, and a gate connected to receive the inverted shadow-D2 signal;
a twelfth PMOS FET having a first S/D connected to the second S/D of the eleventh PMOS FET, a second S/D to supply the D2 signal, and a gate to receive CK1;
an eleventh NMOS FET having a first S/D connected to the second S/D of the twelfth PMOS FET, a second S/D, and a gate to receive CLK; and,
a twelfth NMOS FET having a first S/D connected to the second S/D of the eleventh NMOS FET, a second S/D connected to the second de reference voltage, and a gate to accept the inverted shadow-D2 signal.

11. The HFML-FF of claim 10 wherein the third clocked inverter circuit comprises:
  a thirteenth PMOS FET having a first S/D connected to a first dc reference voltage, a second S/D, and a gate connected to receive the shadow-D1 signal;
  a fourteenth PMOS FET having a first S/D connected to the second S/D of the thirteenth PMOS FET, a second S/D to supply the shadow-D2 signal, and a gate to receive CK2;
  a thirteenth NMOS FET having a first S/D connected to the second S/D of the fourteenth PMOS FET, a second S/D, and a gate to receive CK3; and,
  a fourteenth NMOS FET having a first S/D connected to the second S/D of the thirteenth NMOS FET, a second S/D connected to the second dc reference voltage, and a gate to accept the shadow-D1 signal;
  wherein the fourth clocked inverter comprises:
  an fifteenth PMOS FET having a first S/D connected to the first dc reference voltage, a second S/D, and a gate connected to receive the inverted shadow-D2 signal;
  a sixteenth PMOS FET having a first S/D connected to the second S/D of the fifteenth PMOS FET, a second S/D to supply the shadow-D2 signal, and a gate to receive CK1;
  a fifteenth NMOS FET having a first S/D connected to the second S/D of the sixteenth PMOS FET, a second S/D, and a gate to receive CLK; and,
  a sixteenth NMOS FET having a first S/D connected to the second S/D of the fifteenth NMOS FET, a second S/D connected to the second dc reference voltage, and a gate to accept the inverted shadow-D2 signal.

12. The HFML-FF of claim 11 wherein the ninth clocked pass gate circuit comprises:
  a seventeenth PMOS FET having a first source/drain (S/D) connected to the D2 input signal, a second S/D connected to supply the Q signal, and a gate connected to receive CK1;
  a seventeenth NMOS FET having a first S/D connected to the first S/D of the seventeenth PMOS FET, a second S/D connected to the second S/D of the seventeenth PMOS FET, and a gate to receive CLK;
  wherein the fifth clocked inverter comprises:
  an eighteenth PMOS FET having a first S/D connected to the first dc reference voltage, a second S/D, and a gate connected to receive the inverted shadow-Q signal;
  a nineteenth PMOS FET having a first S/D connected to the second S/D of the eighteenth PMOS FET, a second S/D to supply the Q signal, and a gate to receive CLK;
  an eighteenth NMOS FET having a first S/D connected to the second S/D of the nineteenth PMOS FET, a second S/D, and a gate to receive CK1; and,
  a nineteenth NMOS FET having a first S/D connected to the second S/D of the eighteenth NMOS FET, a second S/D connected to the second dec reference voltage, and a gate to accept the inverted shadow-Q signal.

13. The HFML-FF of claim 12 wherein the tenth clocked pass gate circuit comprises:
  a twentieth PMOS FET having a first SD connected to the selected D2 signal, a second S/D connected to supply the shadow-Q signal, and a gate connected to receive CK1;
  a twentieth NMOS FET having a first S/D connected to the first S/D of the twentieth PMOS FET, a second S/D connected to the second S/D of the twentieth PMOS FET, and a gate to receive CLK;
  wherein the sixth clocked inverter comprises:
  a twenty-first PMOS FET having a first S/D connected to the first dc reference voltage, a second S/D, and a gate connected to receive the inverted shadow-Q signal;
  a twenty-second PMOS FET having a first S/D connected to the second S/D of the twenty-first PMOS FET, a second S/D to supply the shadow-Q signal, and a gate to receive CLK;
  a twenty-first NMOS FET having a first S/D connected to the second S/D of the twenty-second PMOS FET, a second S/D, and a gate to receive CK1; and,
  a twenty-second NMOS FET having a first S/D connected to the second S/D of the twenty-first NMOS FET, a second S/D connected to the second dc reference voltage, and a gate to accept the inverted shadow-Q signal.

14. A hazard-free minimal-latency (HFML) latch comprising:
  a relay gate having an input to accept a D1 signal with a binary value, an input to accept a clock signal (CLK), a first clock signal (CK1) equal to an inverted CLK binary value, with a first delay with respect to CLK, a second clock signal (CK2) having the same binary value as CLK with a second delay greater than the first delay with respect to CLK, and a third clock signal (CK3) equal to the inverted CLK binary value, with a third delay greater than the second delay with respect to CLK, an input to accept an inverted shadow-D2 signal, and an output to supply a D2 signal with a binary value; and,
  a shadow gate having an input to accept the D1 signal, an input to accept CLK, CK1, CK2, and CK3, and an output to supply the inverted shadow-D2 signal.

15. The HFML latch of claim 14 wherein the relay gate comprises:
  a first clocked pass gate circuit having an input to accept the D1 signal, an input to accept CK2 and CK3, and an output to supply the D2 signal in a pass mode, the D2 signal having a binary value equal to the D1 binary value;
  a first inverter to accept the inverted shadow-D2 signal and supply a slave D2 signal; and,
  a second clocked pass gate circuit having an input to accept the slave D2 signal, an input to accept CLK and CK1, and an output to supply the D2 signal in a hold mode;
  wherein the shadow gate comprises:
  a third clocked pass gate circuit having an input to accept the D1 input signal, an input to accept CK2 and CK3, and an output to supply a shadow-D2 signal in the pass mode;
  a second inverter having an input to accept the shadow-D2 signal and an output to supply the inverted shadow-D2 signal;
  a third inverter having an input to accept the inverted shadow-D2 signal and an output to supply a shadow slave D2 signal; and,
  a fourth clocked pass gate circuit having an input to accept the shadow slave D2 signal, an input to accept CLK and CK1, and an output to supply the shadow-D2 signal in the hold mode.

16. The HFML latch of claim 15 wherein the first clocked pass gate circuit comprises:
  a first PMOS field effect transistor (FET) having a first source/drain (S/D) connected to the D1 input signal, a second S/D connected to supply the D2 signal, and a gate connected to receive CK2;
  a first NMOS FET having a first S/D connected to the first S/D of the first PMOS FET, a second S/D connected to the second S/D of the first PMOS FET, and a gate to receive CK3;
  wherein the second clocked pass gate circuit comprises:

a second PMOS FET having a first S/D connected to receive the slave D2 signal, a second S/D to supply the D2 signal, and a gate connected to receive CK1;

a second NMOS FET having a first S/D connected to the first S/D of the second PMOS FET, a second S/D connected to the second S/D of the second PMOS FET, and a gate to receive CLK;

wherein the third clocked pass gate circuit comprises:

a third PMOS FET having a first SD connected to the D1 signal, a second S/D connected to supply the shadow-D2 signal, and a gate connected to receive CK2;

a third NMOS FET having a first S/D connected to the first S/D of the third PMOS FET, a second S/D connected to the second S/D of the third PMOS FET, and a gate to receive CK3;

wherein the fourth clocked pass gate circuit comprises:

a fourth PMOS FET having a first S/D connected to receive the shadow slave D2 signal, a second S/D to supply the shadow-D2 signal, and a gate connected to receive CK1;

a fourth NMOS FET having a first S/D connected to the first S/D of the fourth PMOS FET, a second S/D connected to the second S/D of the fourth PMOS FET, and a gate to receive CLK.

17. The HFML latch of claim 14 wherein the relay gate comprises:

a first clocked inverter circuit having an input to accept the D1 signal, an input to accept CK2 and CK3, and an output to supply the D2 signal in the pass mode, where the D2 signal has a binary value equal to an inverted D1 signal binary value;

a second clocked inverter circuit having an input to accept the inverted shadow-D2 signal, an input to accept CLK and CK1, and an output to supply the D2 signal;

wherein the shadow gate comprises:

a third clocked inverter circuit having an input to accept the D1 signal, an input to accept the CK2 and CK3, and an output to supply a shadow-D2 signal;

a fourth inverter having an input to accept the shadow-D2 signal and an output to supply the inverted shadow-D2 signal; and, a fourth clocked inverter circuit having an input to accept the inverted shadow-D2 signal, an input to accept CLK and CK1, and an output to supply the shadow-D2 signal.

18. The HFML latch of claim 17 wherein the first clocked inverter circuit comprises:

a fifth PMOS FET having a first source/drain (S/D) connected to a first dec reference voltage, a second S/D, and a gate connected to receive the D1 signal;

a sixth PMOS FET having a first S/D connected to the second S/D of the fifth PMOS FET, a second S/D to supply the D2 signal, and a gate to receive CK2;

a fifth NMOS FET having a first S/D connected to the second S/D of the sixth PMOS FET, a second S/D, and a gate to receive CK3; and, a sixth NMOS FET having a first S/D connected to the second S/D of the fifth NMOS FET, a second S/D connected to a second dc reference voltage having a lower potential than the first dc reference voltage, and a gate to accept the D1 signal;

wherein the second clocked inverter comprises:

a seventh PMOS FET having a first S/D connected to the first dc reference voltage, a second S/D, and a gate connected to receive the inverted shadow-D2 signal;

an eighth PMOS FET having a first S/D connected to the second S/D of the seventh PMOS FET, a second S/D to supply the D2 signal, and a gate to receive CK1;

a seventh NMOS FET having a first S/D connected to the second S/D of the eighth PMOS FET, a second S/D, and a gate to receive CLK; and, an eighth NMOS FET having a first S/D connected to the second S/D of the eleventh NMOS FET, a second S/D connected to the second dc reference voltage, and a gate to accept the inverted shadow-D2 signal.

19. The HFML latch of claim 18 wherein the third clocked inverter circuit comprises:

a ninth PMOS FET having a first source/drain (S/D) connected to a first dc reference voltage, a second S/D, and a gate connected to receive the D1 signal;

a tenth PMOS FET having a first S/D connected to the second S/D of the ninth PMOS FET, a second S/D to supply the shadow-D2 signal, and a gate to receive CK2;

a ninth NMOS FET having a first S/D connected to the second S/D of the tenth PMOS FET, a second S/D, and a gate to receive CK3; and, a tenth NMOS FET having a first S/D connected to the second S/D of the ninth NMOS FET, a second S/D connected to the second dc reference voltage, and a gate to accept the D1 signal;

wherein the fourth clocked inverter comprises:

an eleventh PMOS FET having a first S/D connected to the first dc reference voltage, a second S/D, and a gate connected to receive the inverted shadow-D2 signal;

a twelfth FET having a first S/D connected to the second S/D of the eleventh PMOS FET, a second S/D to supply the shadow-D2 signal, and a gate to receive CK1;

an eleventh NMOS FET having a first S/D connected to the second S/D of the twelfth PMOS FET, a second S/D, and a gate to receive CLK; and, a twelfth N MOS FET having a first S/D connected to the second S/D of the eleventh NMOS FET, a second S/D connected to the second dc reference voltage, and a gate to accept the inverted shadow-D2 signal.

* * * * *